(12) United States Patent
Mallik et al.

(10) Patent No.: US 12,205,915 B2
(45) Date of Patent: *Jan. 21, 2025

(54) MICROELECTRONIC PACKAGE WITH SOLDER ARRAY THERMAL INTERFACE MATERIAL (SA-TIM)

(71) Applicant: Intel Corporation, Santa Clara, CA (US)

(72) Inventors: Debendra Mallik, Chandler, AZ (US); Sergio Antonio Chan Arguedas, Chandler, AZ (US); Jimin Yao, Chandler, AZ (US); Chandra Mohan Jha, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/346,321

(22) Filed: Jul. 3, 2023

(65) Prior Publication Data
US 2023/0343738 A1 Oct. 26, 2023

Related U.S. Application Data

(63) Continuation of application No. 16/451,754, filed on Jun. 25, 2019, now Pat. No. 11,735,552.

(51) Int. Cl.
*H01L 23/00* (2006.01)
*H01L 23/16* (2006.01)
*H01L 23/367* (2006.01)

(52) U.S. Cl.
CPC .............. *H01L 24/17* (2013.01); *H01L 23/16* (2013.01); *H01L 23/3675* (2013.01); *H01L 23/562* (2013.01); *H01L 2224/17051* (2013.01); *H01L 2224/1713* (2013.01); *H01L 2224/17163* (2013.01); *H01L 2224/17181* (2013.01); *H01L 2224/17519* (2013.01)

(58) Field of Classification Search
CPC ......... H01L 24/17; H01L 24/14; H01L 24/73; H01L 23/16; H01L 23/3675; H01L 23/562; H01L 23/367; H01L 23/433; H01L 23/42; H01L 2224/17051; H01L 2224/1713; H01L 2224/17163; H01L 2224/17181; H01L 2224/17519
USPC .......................................................... 257/717
See application file for complete search history.

(56) References Cited

U.S. PATENT DOCUMENTS 11,735,552 B2 * 8/2023 Mallik .................... H01L 24/73
257/717

* cited by examiner

*Primary Examiner* — Jasmine J Clark
(74) *Attorney, Agent, or Firm* — Akona IP PC

(57) ABSTRACT

Embodiments may relate to a microelectronic package that includes a die coupled with a package substrate. A plurality of solder thermal interface material (STIM) thermal interconnects may be coupled with the die and an integrated heat spreader (IHS) may be coupled with the plurality of STIM thermal interconnects. A thermal underfill material may be positioned between the IHS and the die such that the thermal underfill material at least partially surrounds the plurality of STIM thermal interconnects. Other embodiments may be described or claimed.

20 Claims, 13 Drawing Sheets

Identifying a die with a thermal underfill material on a first face of the die
805
Identifying an IHS that includes a plurality of STIM thermal interconnects disposed on a face of the IHS
810
Coupling the die with the IHS such that the plurality of STIM thermal interconnects are at least partially disposed within the thermal underfill material
815
Figure 8

```
┌─────────────────────────────────────────────┐
│        Identifying a face of a die          │
│                    905                      │
└─────────────────────────────────────────────┘
                      │
                      ▼
┌─────────────────────────────────────────────┐
│ Positioning a plurality of STIM thermal     │
│      interconnects on the face of the die   │
│                    910                      │
└─────────────────────────────────────────────┘
                      │
                      ▼
┌─────────────────────────────────────────────┐
│ Dispensing a thermal underfill material on  │
│ the face of the die such that the thermal   │
│ underfill material at least partially       │
│ covers the plurality of STIM thermal        │
│ interconnects                               │
│                    915                      │
└─────────────────────────────────────────────┘
                      │
                      ▼
┌─────────────────────────────────────────────┐
│ Coupling an IHS to the die such that the    │
│ IHS is thermally coupled with the die       │
│ through the plurality of STIM thermal       │
│ interconnects and the thermal underfill     │
│ material                                    │
│                    920                      │
└─────────────────────────────────────────────┘
```

Figure 9

MICROELECTRONIC PACKAGE WITH SOLDER ARRAY THERMAL INTERFACE MATERIAL (SA-TIM)

CROSS-REFERENCE TO RELATED APPLICATION

This application is a continuation of (and claims the benefit and priority under 35 U.S.C. 120 of) U.S. application Ser. No. 16/451,754, filed Jun. 25, 2019, now U.S. Pat. No. 11,735,552, entitled "MICROELECTRONIC PACKAGE WITH SOLDER ARRAY THERMAL INTERFACE MATERIAL (SA-TIM)," the disclosure of which is considered part of, and is incorporated by reference in, the disclosure of this application.

BACKGROUND

Conventional integrated heat spreaders (IHSS) may be attached to a silicon die back side using a thermal interface material (TIM) such as polymer TIM (PTIM) or solder TIM (STIM). Generally, STIM may provide better thermal performance over PTIM, which may be desirable for high-performance processors.

BRIEF DESCRIPTION OF THE DRAWINGS

FIG. 8 depicts a simplified example flowchart of a technique for manufacturing a microelectronic package with a SA-TIM, in accordance with various embodiments.

FIG. 9 depicts an alternative simplified example flowchart of a technique for manufacturing a microelectronic package with a SA-TIM, in accordance with various embodiments.

DETAILED DESCRIPTION

Figure 1:
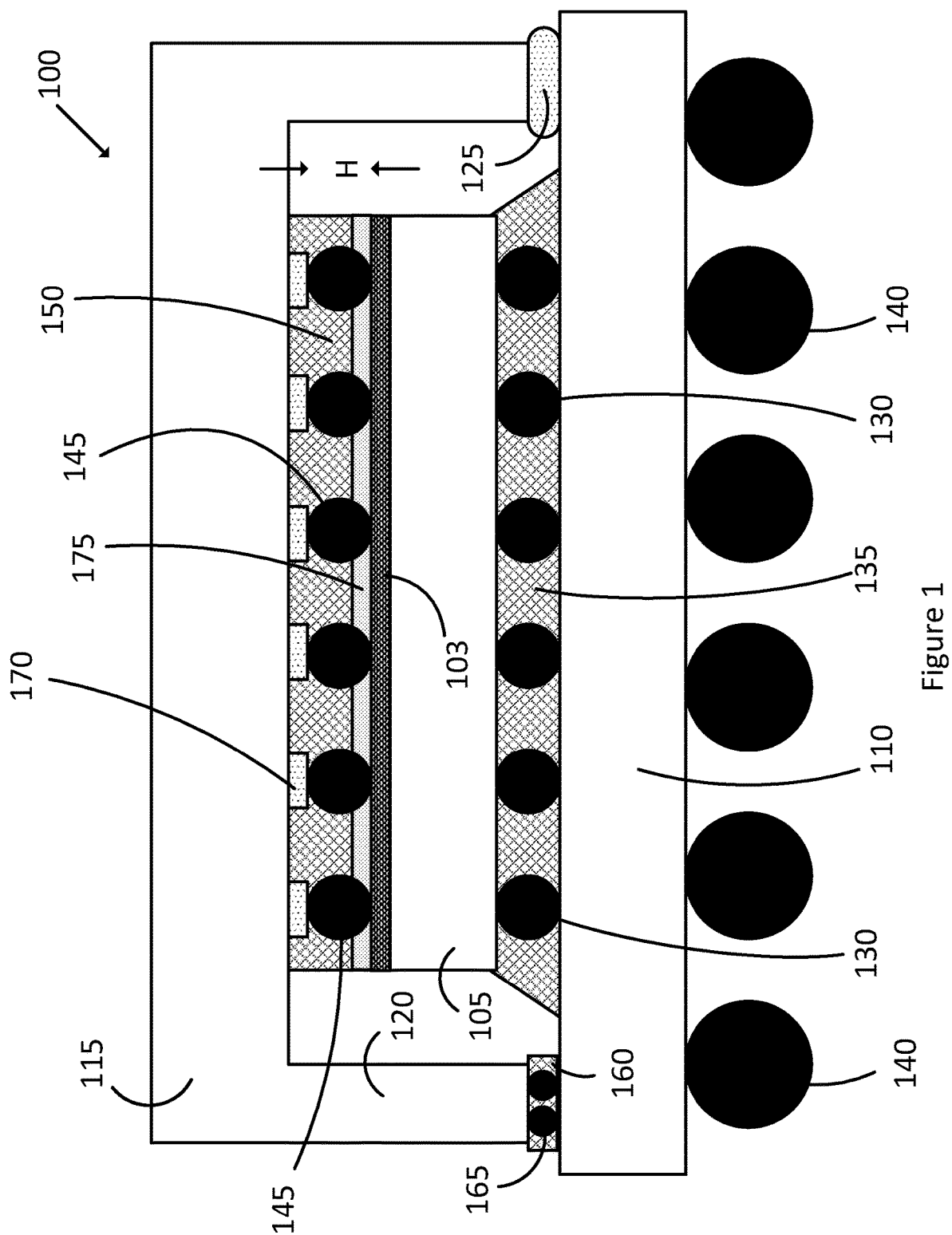
FIG. 1 depicts a simplified cross-sectional view of an example microelectronic package with a solder array TIM (SA-TIM), in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized, and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted above, STIM may be used for microelectronic packages that include high-performance processors. However, when the microelectronic package is a surface-mounted package that is coupled with a package substrate by a ball grid array (BGA), the use of STIM may include one or more challenges. For example, STIM may have a melting point of between approximately 150 degrees Celsius (° C.) and approximately 170° C. However, the BGA solder ball attach and board assembly process may be performed at temperatures between approximately 240° C. and approximately 260° C. Therefore, in legacy packages the STIM may melt and flow out during the BGA solder ball attach or board assembly processes. This melting and flow-out may generate voids in the STIM, which may degrade thermal performance of the microelectronic package or the STIM. Additionally, temperature cycling of the package during product use may further degrade the STIM due to stress in the solder material, causing STIM micro-cracks. Combatting this degradation may require STIM bond line thickness to be on the order of approximately 300 micrometers ("microns"), resulting in reduced thermal performance of the STIM.

Embodiments herein relate to use of a SA-TIM as the interface between the IHS and the die. Specifically, the SA-TIM may include an array of solder contacts instead of a single large piece of STIM. The solder contacts may be mechanically protected by polymer underfill material which fills the spaces between the solder contacts. As a result, the z-height (i.e., the height of the contacts as measured in a direction perpendicular to the face of the die to which they are attached) of the contacts and the overall STIM layer may be on the order of less than 150 microns. For example, the height of the contacts and the overall STIM layer may be less than 100 microns, and in some embodiments, less than 50 microns. This z-height may be significantly lower than the height of the STIM layer in legacy microelectronic packages which may be on the order of between approximately 300 and approximately 400 microns so that the legacy STIM layer may be robust against the above-described challenges.

The SA-TIM may provide a number of advantages over legacy packages. For example, the polymer material that surrounds individual solder contacts in the SA-TIM may help prevent the STIM squeeze-out or flow-out during BGA ball attach, board assembly, or during product use. Additionally, the relatively small size of the contacts may allow the STIM bond line to be thinner than the z-height of the STIM layer in legacy packages. As a result, the area of individual solder contacts and the bond line thickness over a die may be altered to accommodate chip height variations within a multi-chip package (MCP).

FIG. 1 depicts a simplified cross-sectional view of an example microelectronic package 100 with a solder array TIM (SA-TIM), in accordance with various embodiments. The microelectronic package 100 may include a die 105 coupled with a package substrate 110. The die 105 may be or include, for example, a processor such as a central processing unit (CPU), general processing unit (GPU), a core of a distributed processor, or some other type of processor. Alternatively, the die 105 may be include a memory such as a double data rate (DDR) memory, a non-volatile memory (NVM), a volatile memory, a read-only memory (ROM), or some other type of memory or die. In some embodiments the die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include one or more passive components such as capacitors, resistors, etc. The various active or passive components may be positioned within, partially within, or on the surface of the die 105.

The die 105 may be coupled with a package substrate 110. The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. It will be understood that although the package substrate 110 is discussed herein as an element of the microelectronic package 100, in other embodiments the package substrate 110 may be considered to be an element separate from the microelectronic package 100 to which the microelectronic package 100 is coupled. For the sake of ease of description herein, the package substrate 110 will generally be discussed as an element of the microelectronic package 100 without taking a specific position on this possible difference in naming convention.

Generally, the die 105 may be coupled with the package substrate 110 by one or more interconnects 130. The interconnects 130 may be, for example, solder bumps that are formed of a material such as tin, silver, copper, etc. If solder bumps are used for the interconnects 130, then the solder bumps may be elements of a BGA as shown in FIG. 1. In other embodiments, the interconnects 130 may be pins of a pin grid array (PGA), elements of a land grid array (LGA), or some other type of interconnect. Generally, the interconnects 130 may physically or communicatively couple the die 105 with the package substrate 110. For example, the interconnects 130 may physically couple with, and allow electrical signals to pass between, pads of the die 105 and pads of the package substrate 110 (not shown for the sake of elimination of clutter of FIG. 1).

The microelectronic package may further include an underfill material 135. The underfill material 135 may at least partially surround the interconnects 130, and may at least partially fill the space between the die 105 and the package substrate 110. Generally, the underfill material 135 may lend further structural stability to the microelectronic package 100 and strengthen the connection between the die 105 and the package substrate 110. The underfill material 135 may be formed of a polymer material such as epoxy or some other material. As can be seen, the underfill material 135 may at least partially extend from the die footprint. That is, the underfill material 135 may at least partially extend on one or more sides from the space between the die 105 and the package substrate 110 in a direction parallel to the face of the package substrate 110 to which the die 105 is coupled (e.g., horizontally as situated in FIG. 1).

The microelectronic package 100 may further include a back-side metallization (BSM) layer 103 coupled with the backside of the die 105. The BSM layer 103 may be composed of gold, silver, titanium, chromium, vanadium, tungsten, nickel, combinations or alloys thereof, or some other material. Generally, embodiments herein may be described in terms of an element (e.g. a STIM thermal interconnect, an underfill, or some other element) being coupled with the die 105 or the face of the die 105. It will be understood that such a description is intended as a general statement and in some real-world embodiments the element may more precisely be viewed as being coupled with the BSM layer 103, an intermetallic compound (IMC) that is adjacent the BSM layer, the face of the die 105, some other layer that is not discussed herein, or combinations thereof.

The microelectronic package 100 may further include interconnects 140, which may be similar to interconnects 130. Specifically, the interconnects 140 may be, for example, solder bumps that are formed of a material such as tin, silver, copper, etc. If solder bumps are used for the interconnects 140, then the solder bumps may be elements of a BGA as shown in FIG. 1. In other embodiments, the interconnects 140 may be pins of a PGA, elements of a LGA, or some other type of interconnect. Generally, the interconnects 140 may physically or communicatively couple the package substrate 110, and the microelectronic package 100 in general, with another element of an electronic device such as a printed circuit board (PCB), a motherboard, an interposer, or some other type of element of the electronic device. For example, the interconnects 140 may physically couple with, and allow electrical signals to pass between, the other element of the electronic device and pads of the package substrate 110 (not shown for the sake of elimination of clutter of FIG. 1).

The microelectronic package 100 may further include an IHS 115 that is thermally coupled with the die 105. Generally, the IHS 115 may be formed of a thermally conductive material such as copper. The IHS 115 may thermally couple with the die 105 at one side of the IHS 115, and thermally couple with a thermal solution such as a vapor chamber, fins, a heat sink, or some other type of thermal solution (not shown for the sake of lack of clutter of the Figure). The IHS 115 may serve as an interface between the die 105 and the thermal solution such that thermal energy generated by the die is transferred to the IHS 115 where it can then be transferred to the thermal solution.

Generally, in legacy microelectronic packages, the IHS 115 may be thermally coupled with the die 105 by a STIM layer. In legacy packages, the STIM layer may be a unitary piece of solder material such as indium or an indium-containing solder material. However, as can be seen in FIG. 1, the STIM layer may include two elements. Specifically, the STIM layer may include a plurality of STIM thermal interconnects 145. The STIM thermal interconnects 145 may be, for example, balls of a STIM material such as indium or an indium-containing solder material, or one of the other solder materials described above with respect to interconnects 130. The STIM thermal interconnects 145 may be at least partially surrounded by a polymer underfill 150. In some embodiments the underfill 150 may be a thermal underfill. In some embodiments, the underfill 150 may be similar to the underfill material 135. For example, the underfill 150 may be epoxy or some other type of underfill material. In some embodiments the underfill 150 may be the same material as underfill material 135, while in other embodiments the underfill 150 may be formed of a different material than underfill material 135.

In some embodiments the microelectronic package 100 may include a patterning layer 170 positioned between the STIM thermal interconnects 145 and the IHS 115. The patterning layer 170 may include a material that is deposited onto the IHS 115 and facilitates bonding of the STIM thermal interconnects 145 with the IHS 115. Specifically, the patterning layer 170 may include a photolithographic material or some other material that is deposited on the IHS 115 and then selectively etched or otherwise patterned to make attachment points for the STIM thermal interconnects 145.

It will be understood that the patterning layer 170 depicted in FIG. 1 is a highly simplified embodiment for the sake of discussion, and in other embodiments the patterning layer may be larger, smaller, non-uniform, etc. In some embodiments one or more of the STIM thermal interconnects 145 may be coupled with the IHS 115 without the use of a patterning layer 170. Other alternatives may be present in other embodiments.

In some embodiments, a solder resist layer 175 may be positioned between adjacent ones of the STIM thermal interconnects 145. The solder resist layer 175 may be formed of, for example, a polymer or some other appropriate solder resist material. In embodiments, the solder resist layer may be to at least partially prevent the STIM thermal interconnects 145 from expanding during reflow and contacting one another which could have negative physical, electrical, or thermal consequences to the microelectronic package 100. Generally, it will be understood that although the solder resist layer 175 is depicted as a generally unitary and uniform layer, in other embodiments the solder resist layer 175 may have a greater or lesser z-height than depicted in FIG. 1, or the solder resist layer 175 may have a varying z-height along the length of the layer. In some embodiments, one or more of the STIM thermal interconnects 145 may not be separated by the solder resist layer 175. In some embodiments, although the solder resist layer 175 is only depicted on the die-side of the thermal underfill 150, a solder resist layer 175 may be present on the IHS-side of the thermal underfill 150 (for example between the patterning layer 170 and the thermal underfill 150) in addition to, or instead of, the die-side solder resist layer 175. Other variations may be present in other embodiments.

As noted above, in legacy microelectronic packages, the STIM layer may have had a z-height of approximately 300 to 400 microns. However, in embodiments herein the STIM layer (e.g., the underfill 150 and the STIM thermal interconnects 145) may have a z-height H of less than 150 microns. For example, the STIM thermal interconnects 145 may have a height (or diameter if they are generally spherical) of less than approximately 100 microns and, in some embodiments, less than approximately 50 microns.

It will be understood that the depiction of the STIM thermal interconnects 145 as generally spherical and uniformly sized is intended as one example embodiment, and other embodiments may have variations from those depicted in FIG. 1. For example, in some embodiments the STIM thermal interconnects 145 may be shaped as pillars, trapezoidal, pins, or have some other cross-sectional shape. In some embodiments, one or more of the STIM thermal interconnects 145 may have a different shape or size than another of the STIM thermal interconnects 145, either in the depicted cross-sectional view or in a top-down view as will be discussed in greater detail below. Generally, the specific size and shape of a given STIM thermal interconnect may be based on one or more factors such as localized hot spots of the IHS 115 or the die 105, the specific use case to which the microelectronic package 100 may be put, the profile of the die 105 or the IHS 115 (e.g., whether the die 105 or the IHS 115 have a linear or non-linear profile), the materials used, or some other factor.

Additionally, it will be understood that the STIM thermal interconnects 145 may be arranged in a two-dimensional (2-D) array on the face of the IHS 115 or the die 105. Specifically, the STIM thermal interconnects 145 may be arranged in a pattern such that the STIM thermal interconnects 145 at least partially cover the face of the die 105 along at least part of the length of the die (e.g., from right-to-left as oriented in FIG. 1) and the width of the die (e.g., into and out of the page as oriented in FIG. 1).

Figure 10:
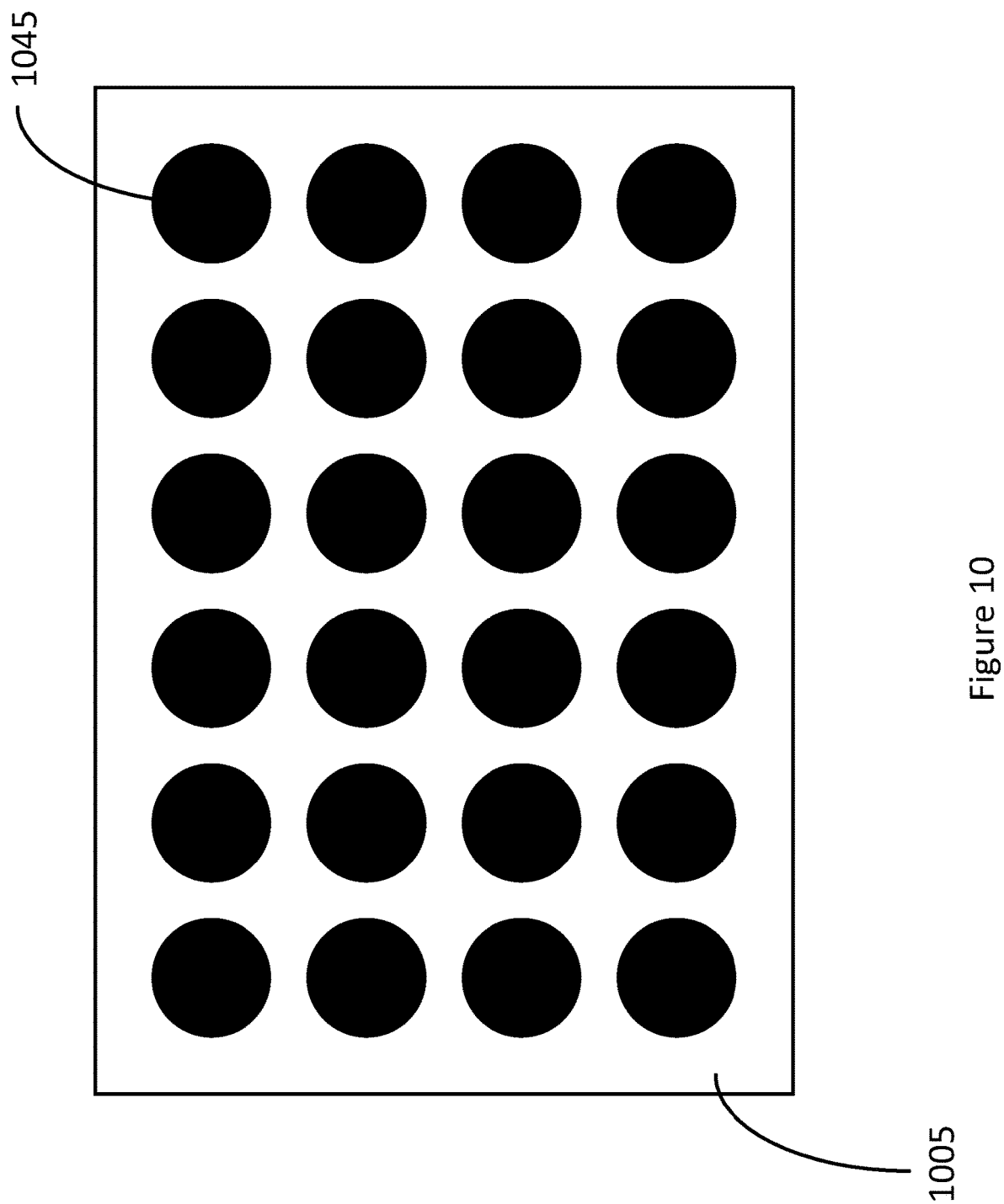
FIG. 10 depicts a simplified top-down view of a SA-TIM, in accordance with various embodiments.
Figure 11:
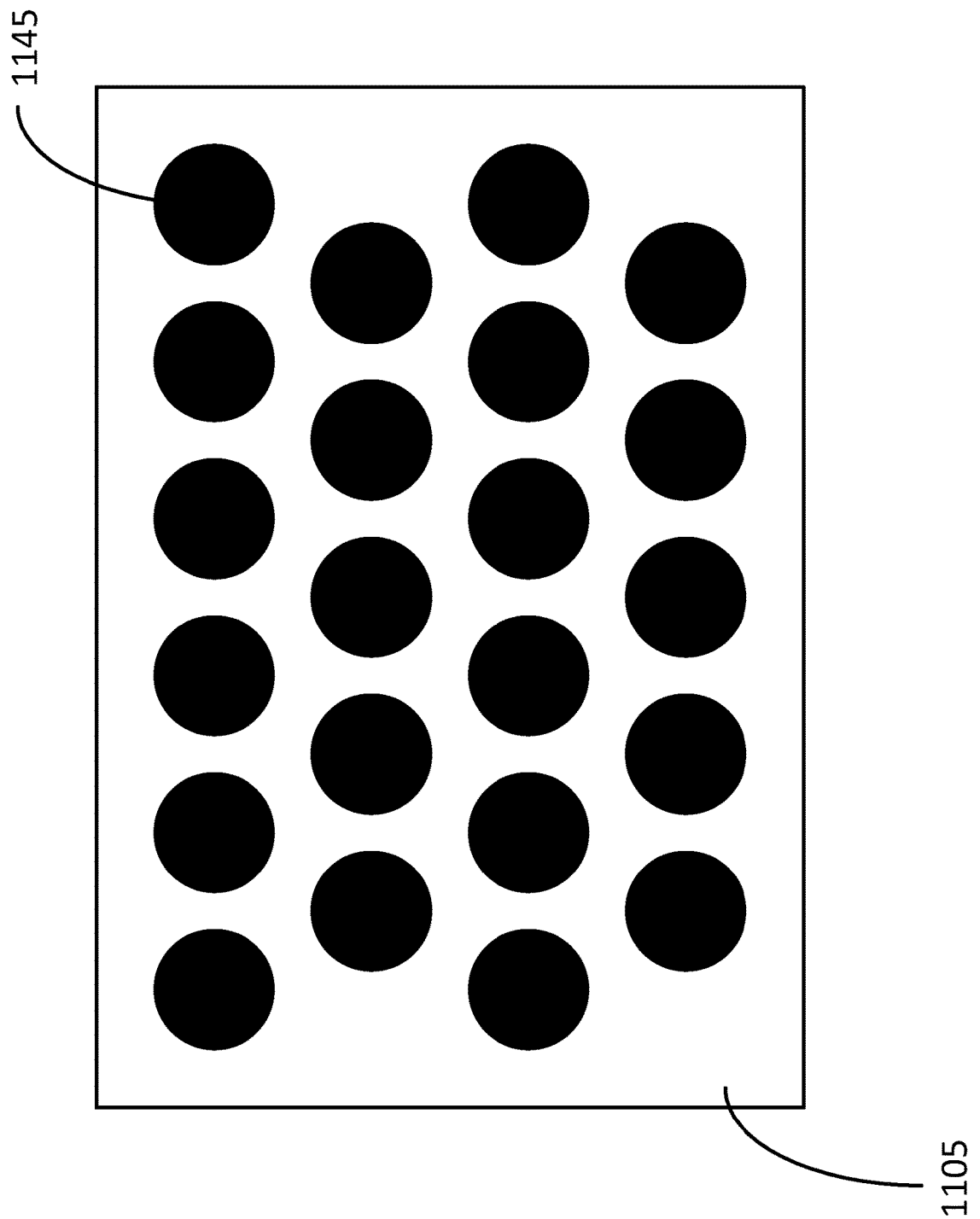
FIG. 11 depicts an alternative simplified top-down view of a SA-TIM, in accordance with various embodiments.
Figure 12:
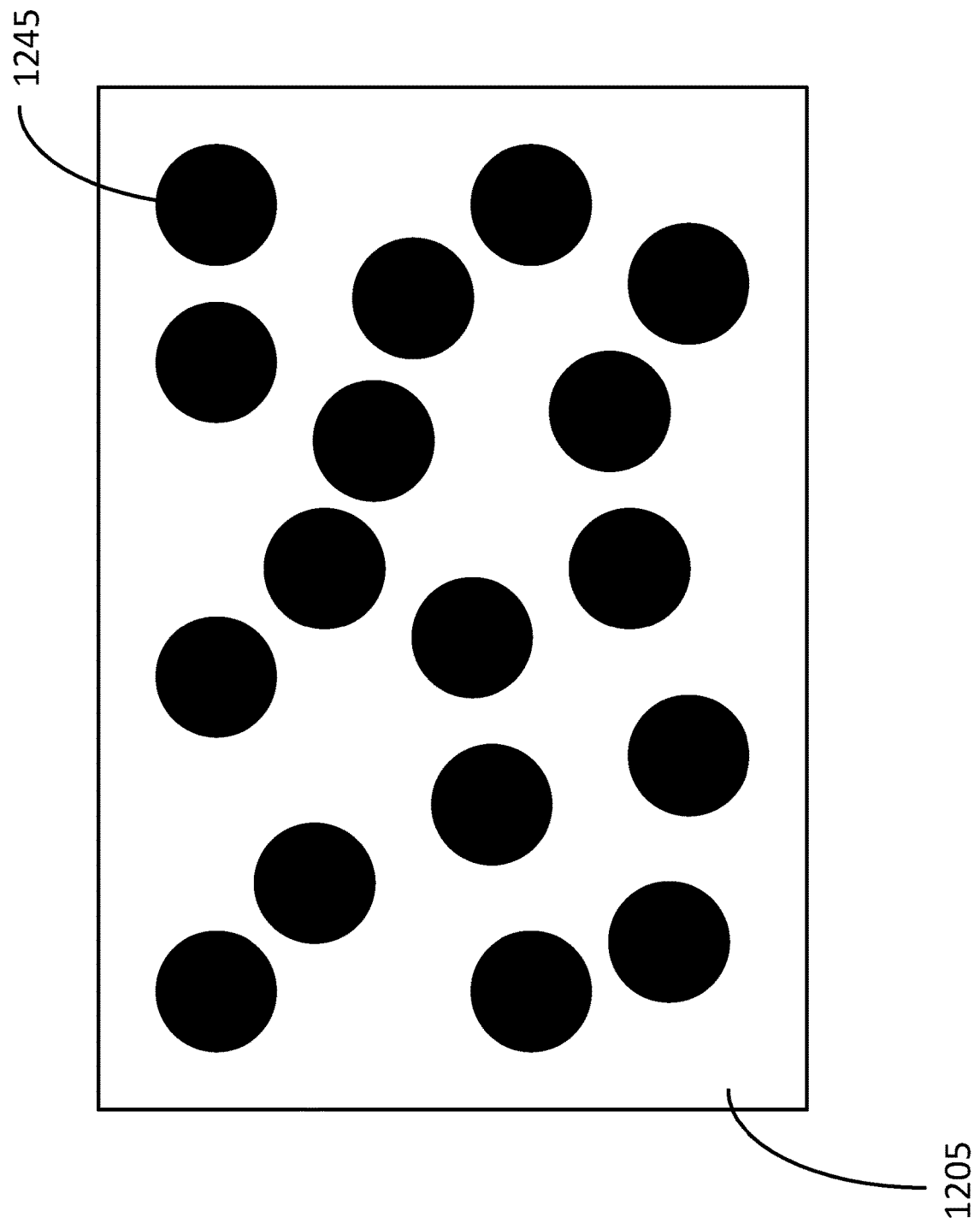
FIG. 12 depicts an alternative simplified top-down view of a SA-TIM, in accordance with various embodiments.
Figure 13:
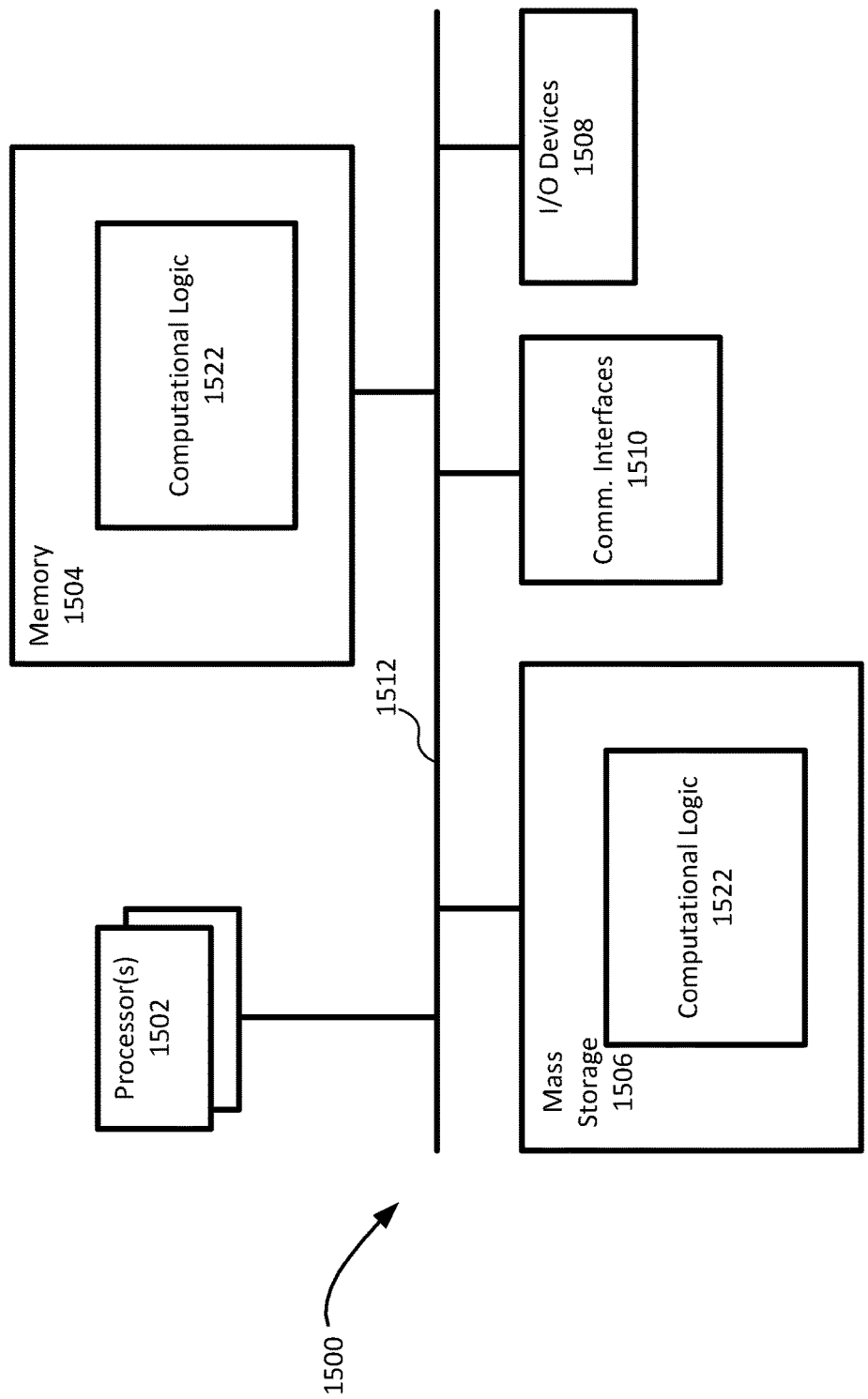
FIG. 13 illustrates an example device that may use a SA-TIM, in accordance with various embodiments.

FIGS. 10-12 depict examples of such a 2-D orientation. It will be understood that FIGS. 10-12 are intended as highly simplified Figures and certain elements such as thermal underfills, BSM layers, etc. may not be specifically depicted in FIGS. 10-12.

FIG. 10 depicts a simplified top-down view of a SA-TIM, in accordance with various embodiments. Specifically, FIG. 10 depicts a face of a die 1005 and a plurality of STIM thermal interconnects 1045, which may be respectively similar to, and share one or more characteristics with, die 105 and STIM thermal interconnects 145. As can be seen, the STIM thermal interconnects 1045 may be generally arranged in a grid-like pattern on the face of the die 1005. Specifically, the STIM thermal interconnects 1045 may be generally positioned along two perpendicular axes along the face of the die 1005.

FIG. 11 depicts an alternative simplified top-down view of a SA-TIM, in accordance with various embodiments. Similarly to FIG. 10, FIG. 11 depicts a face of a die 1105 and a plurality of STIM thermal interconnects 1145, which may be respectively similar to, and share one or more characteristics with, die 105 and STIM thermal interconnects 145. As can be seen, the STIM thermal interconnects 1145 may be generally arranged in a hexagonal pattern on the face of the die 1105. Specifically, the STIM thermal interconnects 145 may be arranged along the face of the die 1105 according to three axes as depicted.

FIG. 12 depicts an alternative simplified top-down view of a SA-TIM, in accordance with various embodiments. Similarly to FIG. 10, FIG. 12 depicts a face of a die 1205 and a plurality of STIM thermal interconnects 1245, which may be respectively similar to, and share one or more characteristics with, die 105 and STIM thermal interconnects 145. As can be seen, the STIM thermal interconnects 1245 may be randomly positioned on the face of the die 1205. That is, the STIM thermal interconnects 1245 may be positioned on the face of the die 1205 such that they generally cover the length and width of the die 1205, however they may not be positioned according to a specific axis or set of axes.

It will be understood that the above depicted configurations of the STIM thermal interconnects 1045/1145/1245 are intended as examples of various configurations that may be used. Instead of, or in addition to, the grid-like, hexagonal, or random arrangement of STIM thermal interconnects, one or more other patterns may be used. For example, patterns of the STIM thermal interconnects may include triangular arrangements, circular arrangements, pseudo-random arrangements, or some other arrangement of STIM thermal interconnects. Additionally, as noted above, although the various STIM thermal interconnects are depicted as having a generally circular cross-section with a uniform diameter, in some embodiments one or more of the STIM thermal interconnects may have a different cross-section such as square, triangular, rectangular, oval, etc. In some embodiments one or more of the STIM thermal interconnects may have a different size than another of the STIM thermal interconnects. For example, one of the STIM thermal interconnects may be larger or smaller than another of the STIM thermal interconnects. As noted above, in some embodiments the STIM thermal interconnects may be positioned, sized, or shaped according to one or more factors such as localized hot spots of the die, use cases, profiles of the dies, etc.

Returning to FIG. 1, the IHS 115 may include one or more legs 120. Generally, the legs 120 may be considered to be protrusions from the IHS 115 that generally surround the die 105 and couple with the package substrate 110. In some embodiments, the leg 120 may be a single protrusion that is generally ring-shaped, square-shaped, rectangular, or have some other shape. In other words, the leg 120 may be a unitary piece of material that fully or partially surrounds the die 105. In other embodiments, the IHS 115 may have a plurality of distinct legs that individually couple with the package substrate 110.

In some embodiments one or more of the legs 120 may couple with the package substrate 110 through an adhesive 125. The adhesive 125 may be, for example, a conductive or a non-conductive adhesive material such as an epoxy material which may have thermally or electrically conductive filler particles. For example, in some embodiments the IHS 115 and the package substrate 110 may have data or power connections that are routed through the adhesive 125, and therefore a conductive adhesive may serve both a physical/structural purpose as well as a communicative purpose. In other embodiments the adhesive 125 may be non-conductive and may serve to physically/structurally couple the IHS 115 to the package substrate 110.

In some embodiments one or more of the legs 120 may be coupled with the package substrate 110 through one or more solder bumps 165. In embodiments, the solder bumps 165 may be similar to the STIM thermal interconnects 145 or the interconnects 130 described above. That is, the solder bumps 165 may be formed of a solder material such as indium, an indium-containing solder material, tin, silver, copper, etc. In embodiments, the solder bumps 165 may be at least partially surrounded by an underfill 160. The underfill 160 may be an underfill material such as those discussed above with respect to underfill 150 or underfill 135. In some embodiments, the underfill 160 may be the same material as the underfill 150 or the underfill 135, or the underfill 160 may be a different underfill material than underfills 150 or 135.

It will be understood that FIG. 1 is intended to depict examples of various elements or configurations that may be used in some embodiments. Elements of other embodiments may have one or more variations from those shown in FIG. 1. For example, in some embodiments both legs 120 of the IHS 115 may be coupled with the package substrate 110 by an adhesive 125. In some embodiments both legs 120 of the IHS 115 may be coupled with the package substrate 110 by solder bumps 165 and underfill 160. In some embodiments the relative sizes of various elements may be different than depicted. For example, in some embodiments the solder bumps 165 may be approximately the same size (e.g., the same diameter, the same z-height, etc.) as STIM thermal interconnects 145, interconnects 130, or interconnects 140. Other variations may be present in other embodiments.

In some embodiments, the IHS may have a different shape or configuration than depicted in FIG. 1. For example, in many microelectronic packaging scenarios a flat IHS plus peripheral support may have a lower cost structure when compared to an IHS with legs such as IHS 115. In embodiments herein, a flat IHS may offer even more cost benefit due to it having a flat surface for attachment of STIM thermal interconnects. In some embodiments, the IHS 115 may be directly physically coupled with the die 105, rather than thermally coupled with the die as depicted in FIG. 1.

Figure 2:
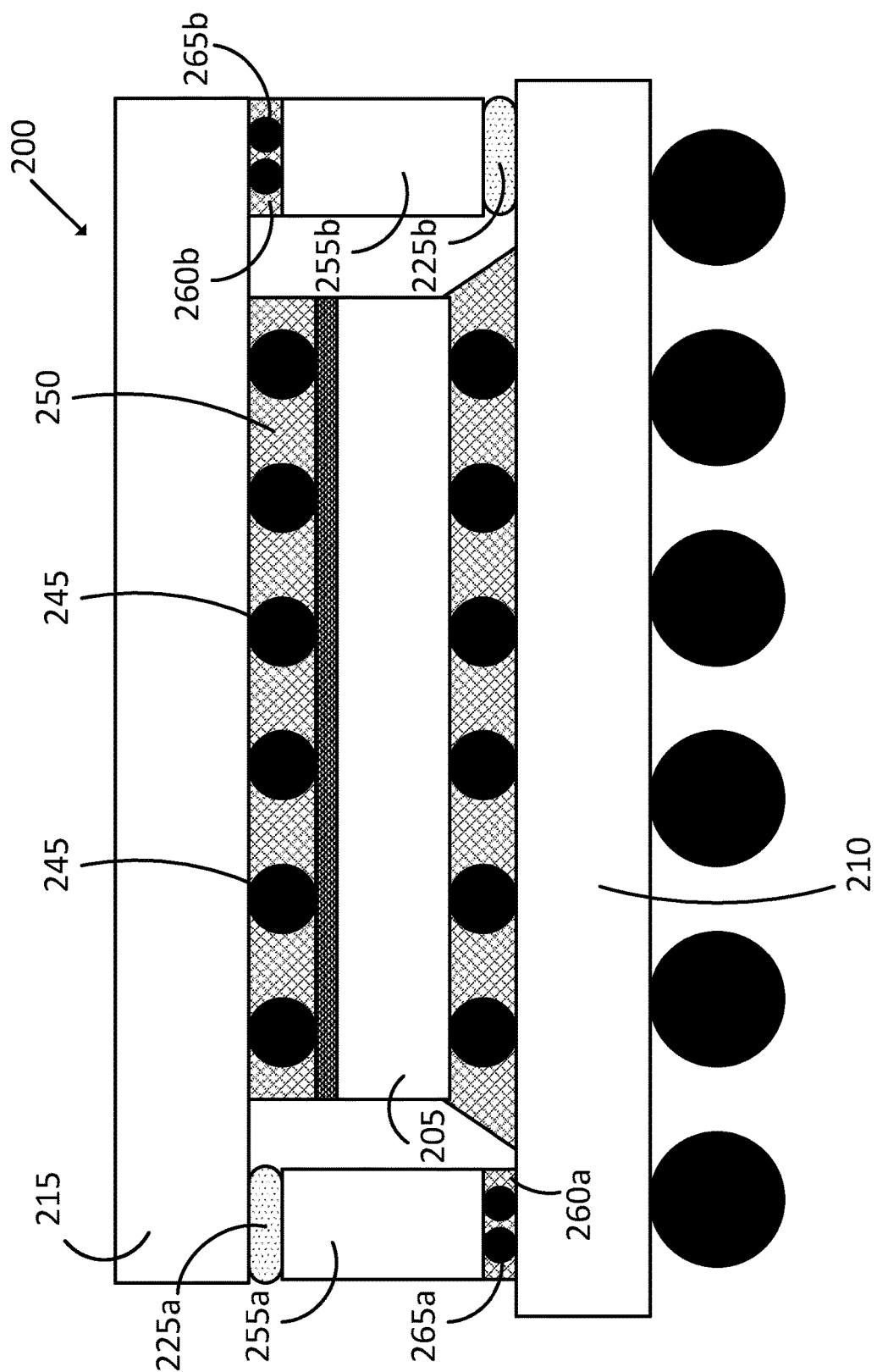
FIG. 2 depicts an alternative simplified cross-sectional view of an example microelectronic package with a SA-TIM, in accordance with various embodiments.

FIG. 2 depicts an alternative simplified cross-sectional view of an example microelectronic package 200 with a SA-TIM, in accordance with various embodiments. Specifically, FIG. 2 depicts a flat IHS attached to a stiffener on a package substrate. In some embodiments, the stiffener may also be referred to as a "spacer." Generally, a stiffener may serve one or both of two functions. In some microelectronic packages, the stiffener may reinforce the package by stiffening the outer periphery of the microelectronic package. In some microelectronic packages, the stiffener may provide a mechanical load bearing spacing between the IHS and the package substrate.

In embodiments, the stiffeners may be formed of a material such as steel, copper, aluminum, or polymer, with or without reinforcement. These materials may be desirable if the stiffener is to reinforce the outer periphery of the microelectronic package as described above. In some embodiments, the stiffeners may be formed of a material such as silicon, glass or ceramic blocks, etc. The stiffeners may include or be coupled with passive components such as capacitors, resistors, inductors, etc. These materials may be desirable if the stiffener is to provide the mechanical load bearing spacing as described above. In some embodiments the stiffeners may include a combination of the above-described materials or elements. Additionally, in some embodiments the stiffener may be formed of a single "donut-shaped" piece of material, whereas in other embodiments the stiffener may be formed of a plurality of pieces of material that are positioned generally between the IHS and the package substrate.

The microelectronic package 200 of FIG. 2 may include elements that are similar to, and share one or more characteristics with, elements of the microelectronic package 100 of FIG. 1. It will be noted that each and every element of FIG. 2 may not be specifically enumerated, however elements of FIG. 2 that are similar to those of FIG. 1 (e.g., various interconnects, underfills, BSM layer, etc.) may be considered to share characteristics with those elements of FIG. 1.

The microelectronic package 200 may include a die 205, package substrate 210, STIM thermal interconnects 245, and underfill 250 which may be respectively similar to, and share one or more characteristics of, die 105, package substrate 110, STIM thermal interconnects 145, and underfill 150. The microelectronic package 200 may also include an IHS 215, which may be similar to, and share one or more characteristics of, IHS 115. Specifically, the IHS 215 may be formed for a thermally conductive material such as copper or some other material. Notably, the IHS 215 may be a "flat" IHS that does not have legs such as legs 120.

The microelectronic package 200 may also include a one or more stiffeners such as stiffeners 255a and 255b (collectively, "stiffeners 255"). As noted, although the stiffeners 255 are depicted and enumerated as two separate elements, in some embodiments the stiffeners 255 may be a unitary piece of material. As noted above, the stiffeners 255 may be formed of or include various materials such as steel, copper, aluminum, polymer, silicon, glass or ceramic blocks, reinforcing elements, passive components, etc.

As can be seen, the stiffeners may be coupled with the IHS 215 or the package substrate 210 through an adhesive. For example, stiffener 255a may be coupled with the IHS 215 by way of an adhesive 225a which may be similar to, and share one or more characteristics of, adhesive 125. Similarly, stiffener 255b may be coupled with the package substrate 210 by way of an adhesive 225b (collectively, adhesives 225a and 225b may be referred to as "adhesives 225").

Similarly, in some embodiments a stiffener 255 may be coupled with the package substrate 210 or the IHS 215 through use of an interconnect and an underfill. For example, stiffener 255a may be coupled with the package substrate 210 using one or more solder bumps 265a that are at least partially surrounded by an underfill 260a. Stiffener 255b may be coupled with the IHS 215 using one or more solder bumps 265b that are at least partially surrounded by an underfill 260b (collectively, underfills 260a and 260b may be referred to as "underfills 260," while solder bumps 265a and 265b may be referred to as "solder bumps 265"). The solder bumps 265 and underfill 260 may be respectively similar to, and share one or more characteristics of, solder bumps 165 and underfill 160.

It will be understood that this depiction of the microelectronic package 200 is intended as an example to depict various possible configurations. Variations may be present in other embodiments. For example, in some embodiments various ones of the stiffeners 255 may be coupled with the IHS 215 or the package substrate 210 through an adhesive such as adhesive 225, or interconnects and underfill such as solder bumps 265 and underfill 260. For example, all of the stiffeners 255 (or each connection point of a single stiffener) may be coupled with the IHS 215 or the package substrate 210 using an adhesive 225 or a combination of solder bumps 265 and underfill 260.

Figure 3:
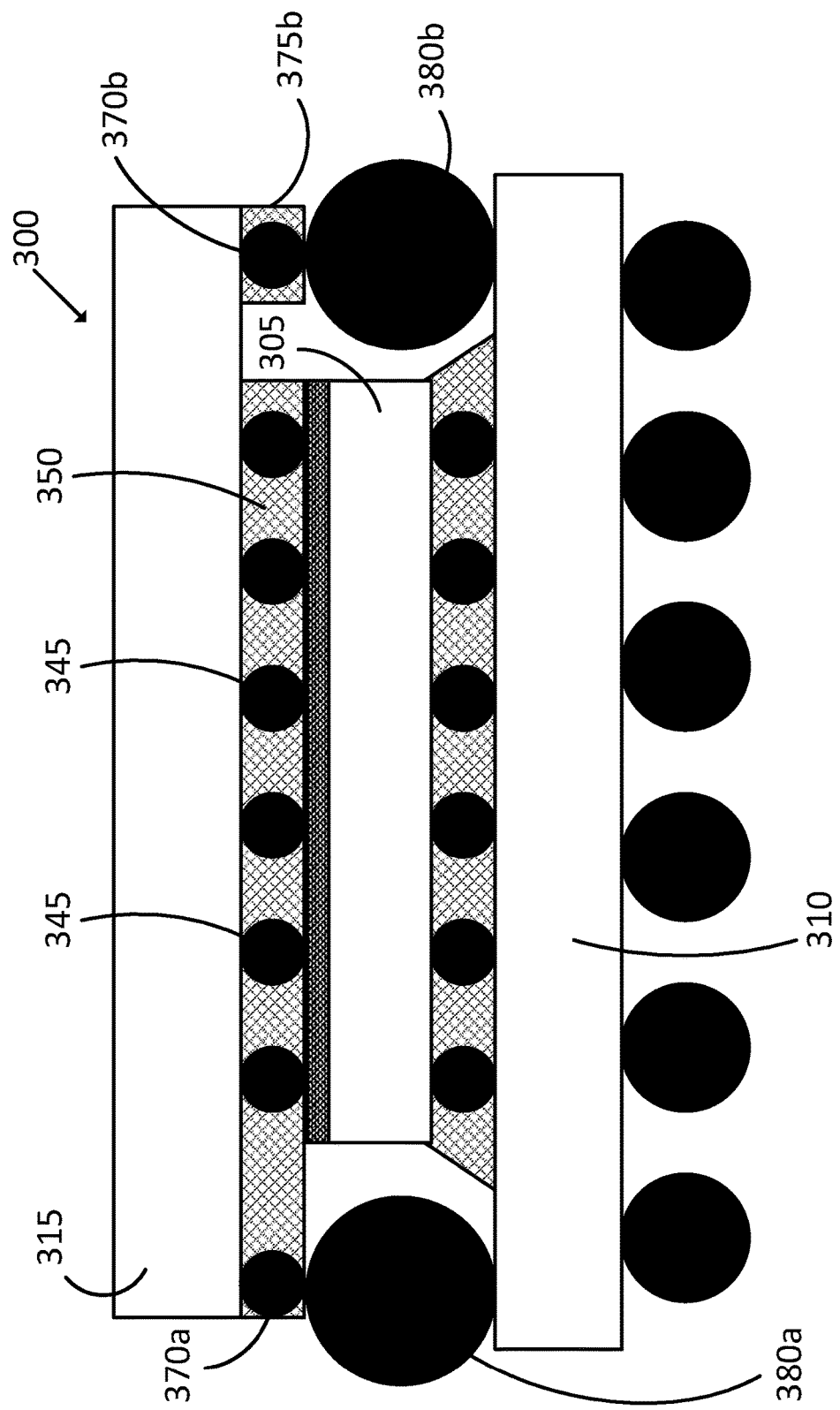
FIG. 3 depicts an alternative simplified cross-sectional view of an example microelectronic package with a SA-TIM, in accordance with various embodiments.

In some embodiments, the stiffener may take the form of a solder ball or a solder-coated copper ball. FIG. 3 depicts an example of such a stiffener. Specifically, FIG. 3 depicts an alternative simplified cross-sectional view of an example microelectronic package 300 with a SA-TIM, in accordance with various embodiments.

Similarly to FIG. 2, it will be noted that each and every element of FIG. 3 may not be specifically enumerated, however elements of FIG. 3 that are similar to those of other Figures herein may be considered to share characteristics with those elements.

A microelectronic package 300 may include a die 305, a package substrate 310, an IHS 315, and STIM thermal interconnects 345 which may be respectively similar to, and share one or more characteristics of, die 205, package substrate 210, IHS 215, and STIM thermal interconnects 245. The microelectronic package 300 may further include stiffeners 380. In embodiments, one or more of the stiffeners 380 may be a solder ball formed of a material such as indium, tin, silver, copper, or some other solder material. In some embodiments, one or more of the stiffeners may have a core of a material such as copper or some other material.

The stiffeners may physically or communicatively couple with the die 305 through an intervening interconnect such as interconnects 370a and 370b. The intervening interconnects 370a and 370b may be, for example, similar to STIM thermal interconnects 345 as depicted. In other embodiments, one or more of the intervening interconnects 370a and 370b may be similar to interconnects such as interconnects 130. The interconnects 370a and 370b may be at least partially surrounded by an underfill 350 or 375. Underfills 350 and 375 may be similar to, and share one or more characteristics of, underfill 250. In some embodiments, the underfill may extend along the face of the IHS 315 to at least partially surround the interconnect 370a as shown with respect to underfill 350. In some embodiments the underfill may not extend along the face of the IHS and rather may be spaced away from the remainder of the underfill. For example, underfill 375 may be separated from, and spaced away from, underfill 350.

It will be understood that this depiction of the microelectronic package 300 is intended as one example embodiment which may depict various alternative configurations. Other embodiments may have different characteristics. For example, in some embodiments the interconnects 370a or 370b may not be present, and rather the stiffeners 380 may be directly coupled with the IHS 315 (or a pad thereof). In some embodiments the underfill along the face of the IHS 315 may not be fully uniform or fully separated as depicted in FIG. 3, rather in some embodiments underfill 350 and underfill 375 may be partially connected by one or more thin pieces of underfill material. Other variations may be present in other embodiments.

Figure 4:
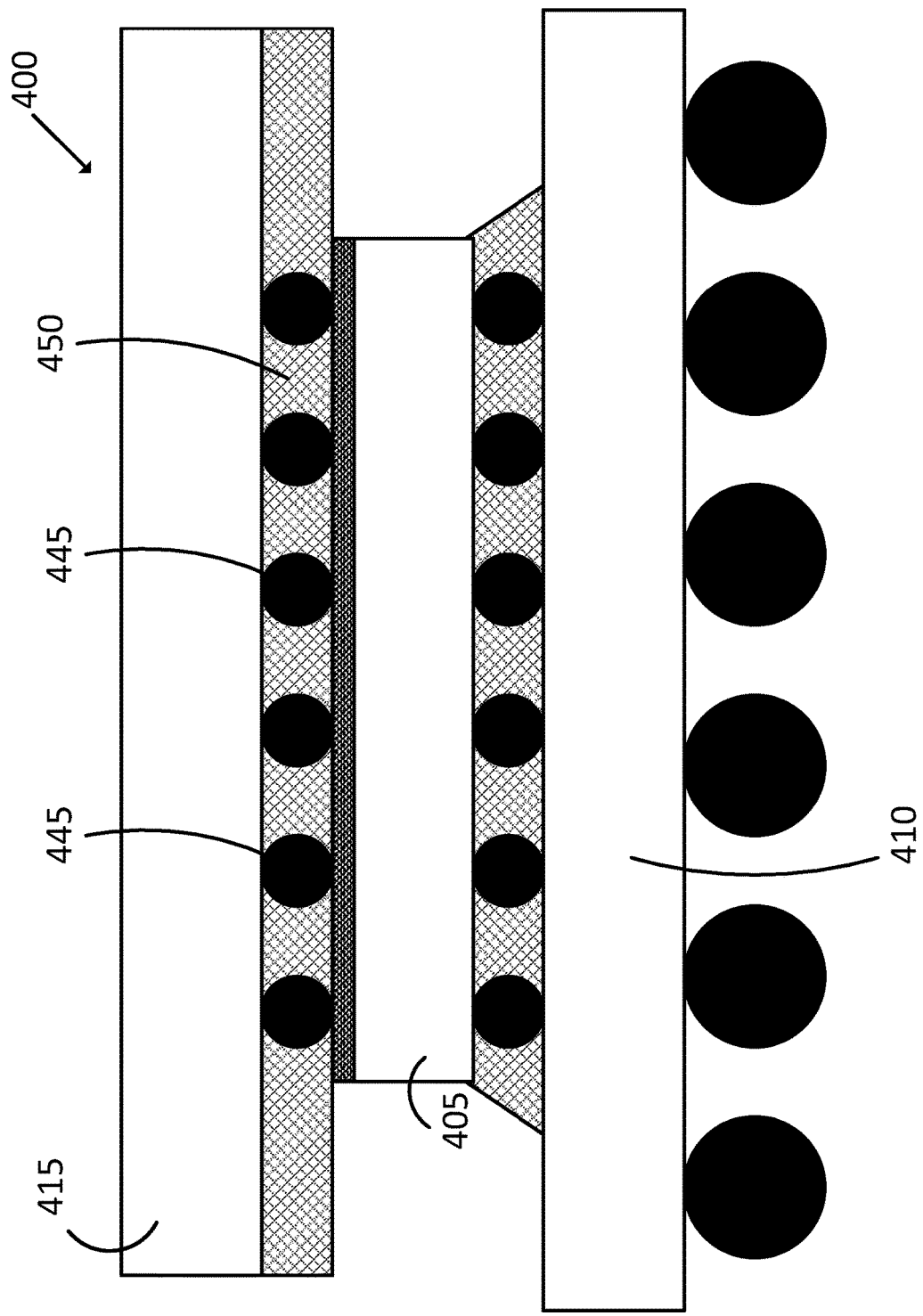
FIG. 4 depicts an alternative simplified cross-sectional view of an example microelectronic package with a SA-TIM, in accordance with various embodiments.

In some embodiments, a flat IHS may be used without any peripheral support such as a stiffener. FIG. 4 depicts such use of a flat IHS. More generally, FIG. 4 depicts an alternative simplified cross-sectional view of an example microelectronic package 400 with a SA-TIM, in accordance with various embodiments. Similarly to other Figures herein, it will be noted that each and every element of FIG. 4 may not be specifically enumerated, however elements of FIG. 4 that are similar to those of other Figures herein may be considered to share characteristics with those elements.

In FIG. 4, a microelectronic package 400 may include a die 405, a package substrate 410, an IHS 415, STIM thermal interconnects 445, and an underfill 450 which may be respectively similar to, and share one or more characteristics of, die 205, package substrate 210, IHS 215, STIM thermal interconnects 245, and underfill 250. As can be seen, the microelectronic package 400 may not include a stiffener such as stiffeners 255 or 380. In some embodiments, the stiffeners may not be present in the microelectronic package 400 because additional structural support may not be necessary. For example, the IHS 415 may not overhang (e.g., extend beyond) the die 405 to such a degree that additional structural support is necessary. As a result, the stiffeners may be avoided for the sake of cost or material savings when manufacturing the microelectronic package 400.

Figure 5:
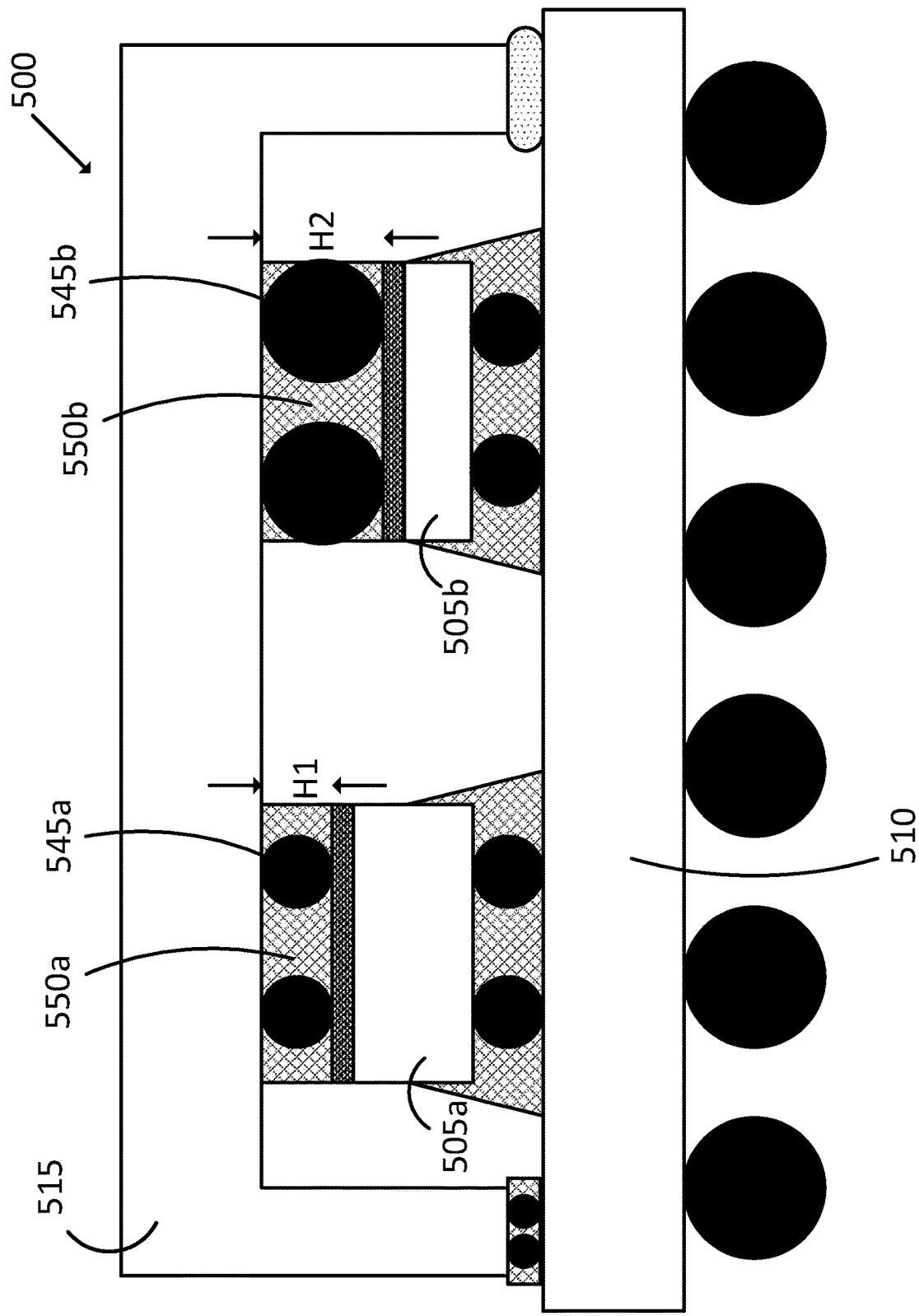
FIG. 5 depicts an alternative simplified cross-sectional view of an example microelectronic package with a SA-TIM, in accordance with various embodiments.

Although embodiments herein have been discussed with respect to a microelectronic package that includes a single die, in other embodiments the microelectronic package may include a plurality of dies in a MCP. FIG. 5 depicts an example of such an MCP. Specifically, FIG. 5 depicts an alternative simplified cross-sectional view of an example microelectronic package 500 with a SA-TIM, in accordance with various embodiments. Similarly to other Figures herein, it will be noted that each and every element of FIG. 5 may not be specifically enumerated, however elements of FIG. 5 that are similar to those of other Figures herein may be considered to share characteristics with those elements.

The microelectronic package 500 may include a package substrate 510 and an IHS 515, which may be respectively similar to, and share one or more characteristics with, package substrate 110 and IHS 115. The microelectronic package 500 may include a plurality of dies 505a and 505b (collectively, "dies 505") which may be similar to, and share one or more characteristics with, die 105. The dies 505 may be thermally coupled with the IHS 515 by STIM thermal interconnects 545a and 545b (collectively, "STIM thermal interconnects 545") which may be similar to, and share one or more characteristics with, STIM thermal interconnects 145. The STIM thermal interconnects 545 may be at least partially surrounded by an underfill 550 which may be similar to, and share one or more characteristics with, underfill 150.

As can be seen, the dies 505a and 505b may have a different z-height than one another. Because the IHS 515 may be generally, flat, the STIM thermal interconnects 545a and 545b may have a different z-height than one another. Specifically, in some embodiments the z-height of STIM thermal interconnects 545a may be H1, and the z-height of STIM thermal interconnects 545b may be H2 (which is greater than H1). However, generally H2 and H1 may be less than approximately 150 microns as described above, and in some embodiments may be less than approximately 100 microns or approximately 50 microns.

It will be understood that this description of this multi-chip microelectronic package 500 is intended as one example embodiment, and other embodiments may have different characteristics. For example, although an IHS with legs is depicted in FIG. 5, in other embodiments the microelectronic package 500 may have an IHS with a relatively flat profile, with or without stiffeners, as depicted in FIGS. 2-4. Additionally, the relative heights H1 and H2 may be considered to be exaggerated for the sake of depiction of various elements, and different heights or height variations may exist in other embodiments.

In general, although various microelectronic packages 100-500 have been discussed herein, it will be understood that these various microelectronic packages are intended as examples and further variations may be present than those discussed above. For example, in some embodiments the stiffeners may have a different profile than that depicted in FIGS. 2-4. For example, the stiffeners may have a square, rectangular, trapezoidal, etc. cross-section. In other embodiments the stiffeners may be columnar, have a circular top-down profile, triangular, square-shaped, or some other type of top-down profile. Additionally, although certain numbers of elements are depicted in the various Figures, it will be understood that other embodiments may have more or fewer elements than depicted (e.g., more or fewer interconnects, STIM thermal interconnects, dies, etc.) than depicted in FIGS. 1-5.

Figure 6:
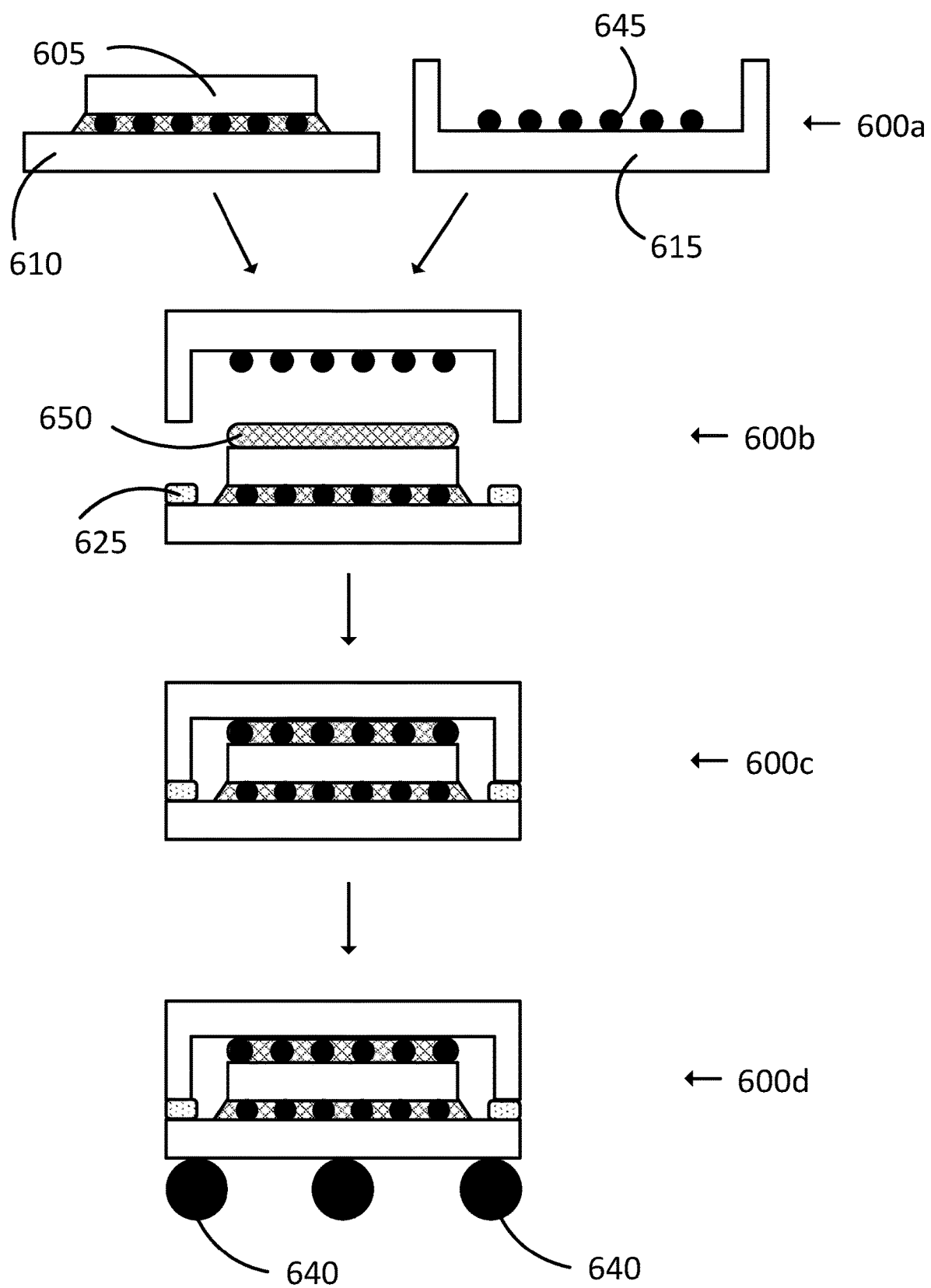
FIG. 6 depicts a simplified example technique for manufacturing a microelectronic package with a SA-TIM, in accordance with various embodiments.
Figure 7:
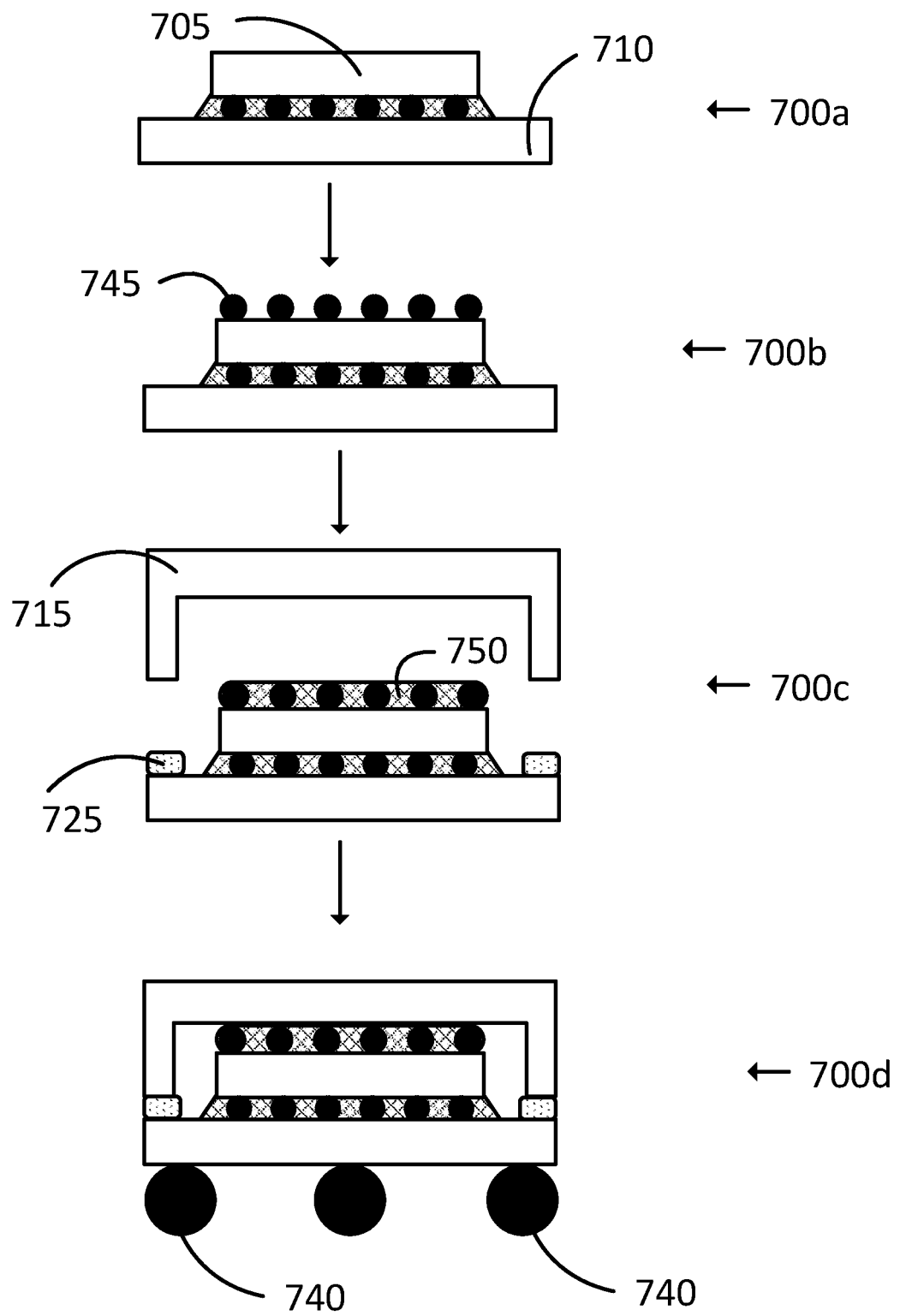
FIG. 7 depicts a simplified alternative example technique for manufacturing a microelectronic package with a SA-TIM, in accordance with various embodiments.

FIGS. 6 and 7 depict simplified example techniques which may be used to manufacture a microelectronic package that includes a SA-TIM array, in accordance with embodiments herein. It will be understood that the techniques depicted in FIGS. 6 and 7 are intended as highly simplified examples, and other embodiments may have significantly more elements, or significantly more complicated elements, than depicted. For example, the FIGS. 6 and 7 may not depict elements such as curing processes, reflow processes, etc. Additionally, each and every element of the Figures (e.g., some interconnects, underfills, etc.) may not be specifically enumerated for the sake of avoidance of clutter, however it will be understood that elements similar to those of FIG. 1 may be considered to have similar characteristics. Finally, it will be understood that although embodiments of the technique are generally described with respect to the manufacturing of a microelectronic package that is similar to microelectronic package 100, a similar technique may be applied, in whole or in part, to generate a microelectronic package that is similar to microelectronic packages 200, 300, 400, 500, or some other microelectronic package.

FIG. 6 depicts one simplified example technique for manufacturing a microelectronic package with a SA-TIM, in accordance with various embodiments. Specifically, as shown at 600a, the technique may include two elements. The first element may include a die 605 coupled with a package substrate 610, which may be respectively similar to, and share one or more characteristics with, die 106 and package substrate 110. The second element may include an IHS 615 with a plurality of STIM thermal interconnects 645 coupled thereto. The IHS 615 and the STIM thermal interconnects 645 may be respectively similar to, and share one or more characteristics with, IHS 115 and STIM thermal interconnects 145.

As shown at 600b, a thermal underfill 650 may be placed on the die 605. The thermal underfill 650 may be similar to, and share one or more characteristics with, thermal underfill 150. The thermal underfill 650 may be placed on the die 605 via a technique such as lamination, deposition, jet dispensation such as inkjet printing, or some other type of technique. Similarly, an adhesive 625 may be positioned on the package substrate 610. The adhesive 625 may be similar to, and share one or more characteristics with, adhesive 125. Similarly to the thermal underfill 650, the adhesive 125 may be positioned on the package substrate 610 via a technique such as lamination, deposition, jet dispensation, or some other type of technique. In some embodiments a mask may be used to place the adhesive 625 or the thermal underfill 650. In some embodiments the placement of the adhesive 625 and the thermal underfill 650 may occur concurrently, whereas in other embodiments the placement of the adhesive 625 and the thermal underfill 650 may occur sequentially.

As shown at 600c, the second element (e.g., the IHS 615 and the STIM thermal interconnects 645) may be coupled with the first element (e.g., the die 605 and the package substrate 610 with the thermal underfill 650 and the adhesive 625). Specifically, the second element may be coupled with the first element such that the STIM thermal interconnects 645 are positioned within the thermal underfill 650. In some embodiments a curing process may then occur such as ultraviolet (UV)-cure, heat-cure, or some other type of cure which may cause the adhesive 625 or the thermal underfill 650 to harden or otherwise adhere to one or more adjacent elements such as the die 605, package substrate 610, IHS 615, or STIM thermal interconnects 645.

As shown at 600d, additional interconnects such as interconnects 640 may be coupled with the package substrate 610. Interconnects 640 may be similar to, and share one or more characteristics with, interconnects 140. It will be understood that in some embodiments interconnects 640 may be coupled with the package substrate 610 prior to the start of the illustrated technique, or concurrently with another element of the technique. Other variations may be present in other embodiments.

FIG. 7 depicts a simplified alternative example technique for manufacturing a microelectronic package with a SA-TIM, in accordance with various embodiments. Specifically, as shown at 700a, the technique may start with an element that include a die 705 coupled with a package substrate. The die 705 and the package substrate 710 may be respectively similar to, and share one or more characteristics with, die 105 and package substrate 110.

As shown at 700b, the technique may further include coupling a plurality of STIM thermal interconnects 745 with the die 705. The STIM thermal interconnects 745 may be similar to, and share one or more characteristics with, STIM thermal interconnects 145. The STIM thermal interconnects 745 may be positioned on the die 705 through a variety of techniques such as pick-and-place or some other technique.

As can be seen at 700c, an IHS such as IHS 715 may then be positioned over the die 705 and the package substrate 710. The IHS 715 may be similar to, and share one or more characteristics with, IHS 115. Additionally, a thermal underfill 750 may be placed on the face of the die 705 such that the thermal underfill 750 at least partially surrounds the STIM thermal interconnects 745. The thermal underfill 750 may be similar to, and share one or more characteristics with, thermal underfill 150. Additionally, an adhesive 725, which may be similar to and share one or more characteristics with adhesive 725, may be positioned on the package substrate 710. As described above, the adhesive 725 or the thermal underfill 750 may be positioned on the die package substrate 710 or the die 705 through various techniques such as lamination, deposition, jet dispensation, etc.

As can be seen at 700d, the IHS 715 may then be coupled with the STIM thermal interconnects 745 and the adhesive 725. Additionally, interconnects 740 (which may be similar to, and share one or more characteristics with, interconnects 140) may be coupled with the package substrate 710 as described above. Similarly to FIG. 6, it will be understood that elements of FIG. 7 may occur separately from one another or generally concurrently with one another. For example, one or more of the positioning of the IHS 715, the placement of the thermal underfill 750, and the placement of the adhesive 725 may occur concurrently with one another, or sequentially with one another. Additionally, the coupling of the IHS at 700d may occur sequentially or concurrently with the coupling of the interconnects 740.

It will be understood that the embodiments depicted in FIGS. 6 and 7 are intended as examples, and other embodiments may involve different elements, more or fewer elements, etc. For example, in some embodiments the adhesive such as adhesive 625 or 725 may not be used. Rather, interconnects and an underfill such as solder bumps 165 and underfill 160 may be used in place of the adhesive. In some embodiments additional elements may be present. For example, an initial element of the technique of FIG. 7 may be to couple the die 705 to the package substrate 710. Alternatively, certain elements of the techniques such as the coupling of interconnects such as interconnects 640 or 740 may not be present in some embodiments of the techniques. Other variations may be present in other embodiments.

FIG. 8 depicts a simplified example flowchart of a technique for manufacturing a microelectronic package with a SA-TIM, in accordance with various embodiments. Generally, FIG. 8 may be described with respect to elements of FIG. 6. However, it will be understood that FIG. 8 may also be applied, in whole or in part, with or without modification, to various other embodiments of the present disclosure. Generally, the technique may be described with respect to the verb "identifying." As used herein, "identifying" may be an action that is performed by a computer system or some other automated entity in a manufacturing facility. Additionally or alternatively, the term "identifying" may relate to an action performed by a human. In other embodiments, the term "identifying" may relate to an action taken by some other entity. Identifying the element may include, for example, verifying that the element is in a desired position or orientation, that the element exists, that the element includes one or more desired characteristics or pre-requisites, selecting the element from a variety of other elements, etc.

The technique may include identifying, at 805, a die with a thermal underfill material on a first face of the die. Specifically, the die may be similar to die 605, and the thermal underfill material may be similar to thermal underfill 650.

The technique may further include identifying, at 810, an IHS that includes a plurality of STIM thermal interconnects disposed on a face of the IHS. The IHS may be similar to, for example, IHS 615 and the STIM thermal interconnects may be similar to, for example, STIM thermal interconnects 645.

The technique may further include coupling, at 815, the die with the IHS such that the plurality of STIM thermal interconnects are at least partially disposed within the thermal underfill material. Such a coupling may be depicted, for example, in FIG. 6 at 600c.

FIG. 9 depicts an alternative simplified example flowchart of a technique for manufacturing a microelectronic package with a SA-TIM, in accordance with various embodiments.

Generally, FIG. 9 may be described with respect to elements of FIG. 7, however it will be understood that FIG. 9 may be applied, in whole or in part, with or without modification, to other embodiments of this disclosure.

The technique may include identifying, at 905, a face of a die. The die may be similar to, for example, die 705. The face of the die may be, for example, the face of the die may be the face of the die 705 that is not facing the package substrate 710.

The technique may further include positioning, at 910, a plurality of STIM thermal interconnects on the face of the die. The STIM thermal interconnects may be similar to, for example, STIM thermal interconnects 745. Placement of the STIM thermal interconnects may be performed as described above with respect to STIM thermal interconnects 745.

The technique may further include dispensing, at 915, a thermal underfill material on the face of the die. The thermal underfill material may be similar to, for example, thermal underfill 750, and may at least partially cover or surround the plurality of STIM thermal interconnects.

The technique may further include coupling, at 920, an IHS to the die. The IHS may be similar to, for example, IHS 715, and the IHS may be coupled with the die as shown at 700c and 700d. Specifically, the IHS may be coupled to the die such that the IHS is thermally coupled with the die through the plurality of STIM thermal interconnects and the thermal underfill material. In other words, the IHS may not be directly physically coupled with the die as shown at 700c or 700d, however the IHS may still be thermally coupled with the die.

It will be understood that FIGS. 8 and 9 are intended as examples of the technique in accordance with various embodiments. Other embodiments may include variations from FIG. 8 or 9. For example, in some embodiments one or both of FIG. 8 or 9 may include additional or alternative elements. In some embodiments, although FIGS. 8 and 9 are generally depicted as having sequential elements, in some embodiments the order of the elements may be changed or certain elements may be performed concurrently with other elements. Other variations may be present in other embodiments.

FIG. 14 illustrates an example computing device 1500 which may include one or more microelectronic packages with a SA-TIM, as discussed herein. As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic random access memory (DRAM), compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid-state mass storage, and so forth. Volatile memory may include, but is not limited to, static and/or DRAM. Non-volatile memory may include, but is not limited to, electrically erasable programmable ROM, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of packages 100-300. For example, in some embodiments the processor 1502, memory 1504, or some other component of the computing device 1500 may be coupled with one or more of the routing traces of one of packages 100-300. Further, in some embodiments the power supply may be coupled with one or more of the power traces of one of packages 100-300.

EXAMPLES OF VARIOUS EMBODIMENTS

Example 1 includes a method of forming a microelectronic package, wherein the method comprises: identifying a die with a thermal underfill material on a first face of the die; identifying an IHS that includes a plurality of STIM thermal interconnects disposed on a face of the IHS; and coupling the die with the IHS such that the plurality of STIM thermal interconnects are at least partially disposed within the thermal underfill material.

Example 2 includes the method of example 1, wherein the die further includes a backside metallization (BSM) layer coupled with the face of the die, and the BSM layer is between the face of the die and the thermal underfill material.

Example 3 includes the method of example 1, further comprising positioning the plurality of STIM thermal interconnects on the face of the IHS.

Example 4 includes the method of example 3, wherein positioning the plurality of STIM thermal interconnects on the face of the IHS includes positioning the plurality of STIM thermal interconnects in a two-dimensional array pattern on the face of the IHS.

Example 5 includes the method of example 4, wherein the two-dimensional array pattern is a grid pattern.

Example 6 includes the method of example 4, wherein the two-dimensional array pattern is a randomized pattern.

Example 7 includes the method of any of examples 1-6, wherein the plurality of STIM thermal interconnects extend less than 150 micrometers from the face of the die.

Example 8 includes the method of example 7, wherein the plurality of STIM thermal interconnects extend less than 100 micrometers from the face of the die.

Example 9 includes the method of example 8, wherein the plurality of STIM thermal interconnects extend less than 50 micrometers from the face of the die.

Example 10 includes the method of any of examples 1-6, wherein the thermal underfill material is epoxy.

Example 11 includes the method of any of examples 1-6, wherein the die is coupled with a package substrate at a second face of the die that is opposite the first face.

Example 12 includes the method of example 11, wherein coupling the die with the IHS includes coupling the IHS with the package substrate.

Example 13 includes the method of example 12, wherein coupling the IHS with the package substrate includes coupling a leg of the IHS with the package substrate.

Example 14 includes the method of example 12, wherein coupling the IHS with the package substrate includes coupling the IHS and the package substrate with a spacer such that the spacer is positioned at least partially between the IHS and the package substrate.

Example 15 includes the method of example 11, further comprising coupling interconnects on a face of the package substrate that is opposite a face to which the die is coupled.

Example 16 includes the method of example 15, further comprising performing a cure on the interconnects on the face of the package at a temperature of between 240 degrees Celsius and 270 degrees Celsius.

Example 17 includes a method of forming a microelectronic package, wherein the method comprises: identifying a face of a die; positioning a plurality of STIM thermal interconnects on the face of the die; dispensing a thermal underfill material on the face of the die such that the thermal underfill material at least partially covers the plurality of STIM thermal interconnects; and coupling an IHS to the die such that the IHS is thermally coupled with the die through the plurality of STIM thermal interconnects and the thermal underfill material.

Example 18 includes the method of example 17, wherein coupling the IHS to the die includes coupling the IHS to the die such that the thermal underfill material and the plurality of STIM thermal interconnects are between the IHS and the die.

Example 19 includes the method of example 17, wherein the die is coupled with a package substrate at a face of the die opposite the face on which the plurality of STIM thermal interconnects are positioned, and wherein coupling the IHS to the die includes coupling the IHS to the package substrate.

Example 20 includes the method of example 19, wherein coupling the IHS with the package substrate includes coupling a leg of the IHS with the package substrate.

Example 21 includes the method of example 19, wherein coupling the IHS with the package substrate includes coupling the IHS and the package substrate with a spacer such that the spacer is positioned at least partially between the IHS and the package substrate.

Example 22 includes the method of example 19, further comprising coupling interconnects on a face of the package substrate that is opposite a face to which the die is coupled.

Example 23 includes the method of example 22, further comprising performing a cure on the interconnects on the face of the package at a temperature of between 240 degrees Celsius and 270 degrees Celsius.

Example 24 includes the method of any of examples 17-23, wherein the plurality of STIM thermal interconnects extend less than 150 micrometers from the face of the die.

Example 25 includes the method of example 24, wherein the plurality of STIM thermal interconnects extend less than 100 micrometers from the face of the die.

Example 26 includes the method of example 25, wherein the plurality of STIM thermal interconnects extend less than 50 micrometers from the face of the die.

Example 27 includes the method of any of examples 17-23, wherein the thermal underfill material is epoxy.

Example 28 includes the method of any of examples 17-23, wherein positioning the plurality of STIM thermal interconnects on the face of the die includes positioning the plurality of STIM thermal interconnects in a two-dimensional array pattern on the face of the die.

Example 29 includes the method of example 28, wherein the two-dimensional array pattern is a grid pattern.

Example 30 includes the method of example 28, wherein the two-dimensional array pattern is a randomized pattern.

Example 31 includes a microelectronic package that includes: a package substrate; a die coupled with the package substrate at a first face of the die; a plurality of STIM thermal interconnects coupled with the die at a second face of the die that is opposite the first face; an IHS coupled with the plurality of STIM thermal interconnects; and a thermal underfill material positioned between the IHS and the die, wherein the thermal underfill material at least partially surrounds the plurality of STIM thermal interconnects.

Example 32 includes the microelectronic package of example 31, further comprising a patterning layer positioned between a STIM thermal interconnect of the plurality of STIM thermal interconnects and the IHS.

Example 33 includes the microelectronic package of example 31, further comprising a solder resist layer coupled to the second face of the die and adjacent to, and at least partially surrounding, a STIM thermal interconnect of the plurality of STIM thermal interconnects.

Example 34 includes the microelectronic package of example 31, further comprising a solder resist layer coupled to the IHS and adjacent to, and at least partially surrounding, a STIM thermal interconnect of the plurality of STIM thermal interconnects.

Example 35 includes the microelectronic package of example 31, wherein a first STIM thermal interconnect of the plurality of STIM thermal interconnects has a different size or shape than a second STIM thermal interconnect of the plurality of STIM thermal interconnects.

Example 36 includes the microelectronic package of any of examples 31-35, wherein the plurality of STIM thermal interconnects are coupled with the second face of the die in a two-dimensional array pattern.

Example 37 includes the microelectronic package of example 36, wherein the two-dimensional array pattern is a grid pattern.

Example 38 includes the microelectronic package of example 36, wherein the two-dimensional array pattern is a randomized pattern.

Example 39 includes the microelectronic package of any of examples 31-35, wherein the die is a first die, the plurality of STIM thermal interconnects are a first plurality of STIM thermal interconnects, and the thermal underfill material is a first thermal underfill material, and wherein the microelectronic package further comprises: a second die that is coupled with the package substrate adjacent to the first die; a second plurality of STIM thermal interconnects coupled with the second die and the IHS; and a second thermal underfill material positioned between the IHS and the second die, wherein the second thermal underfill material at least partially surrounds the second plurality of STIM thermal interconnects.

Example 40 includes the microelectronic package of example 39, wherein the second plurality of STIM thermal interconnects have a same z-height as measured in a direction perpendicular to a face of the second die to which they are coupled as a z-height of the first plurality of STIM thermal interconnects.

Example 41 includes the microelectronic package of example 39, wherein the second plurality of STIM thermal interconnects have a different z-height as measured in a direction perpendicular to a face of the second die to which they are coupled as a z-height of the first plurality of STIM thermal interconnects.

Example 42 includes the microelectronic package of any of examples 31-35, wherein a distance between the second face of the die and the IHS is less than 150 micrometers.

Example 43 includes the microelectronic package of example 42, wherein a distance between the second face of the die and the IHS is less than 100 micrometers.

Example 44 includes the microelectronic package of example 43, wherein a distance between the second face of the die and the IHS is less than 50 micrometers.

Example 45 includes the microelectronic package of any of examples 31-35, wherein the thermal underfill material is epoxy.

Example 46 includes the microelectronic package of example 31, wherein the IHS is coupled with the package substrate.

Example 47 includes the microelectronic package of example 46, wherein a leg of the IHS is coupled with the package substrate.

Example 48 includes the microelectronic package of example 46, wherein the IHS and the package substrate are coupled with a spacer such that the spacer is at least partially between the IHS and the package substrate.

Example 49 includes the microelectronic package of example 48, wherein the spacer is a solder ball.

Example 50 includes the microelectronic package of example 48, wherein the spacer is coupled with the IHS or the package substrate by an adhesive material.

Example 51 includes the microelectronic package of example 48, wherein the plurality of STIM thermal interconnects are a first plurality of STIM thermal interconnects and the thermal underfill material is first thermal underfill material, and wherein the spacer is coupled with the IHS or the package substrate by second plurality of STIM thermal interconnects that are at least partially surrounded by second thermal underfill material.

Example 52 includes a microelectronic package comprising: a first die coupled with a package substrate; a first plurality of STIM thermal interconnects coupled with a face of the first die, wherein the first plurality of STIM thermal interconnects are at least partially surrounded by a first thermal underfill material; and an IHS coupled with the package substrate and the first plurality of STIM thermal interconnects such that the first die is located between the IHS and the package substrate, wherein the IHS includes a leg portion that is coupled with the package substrate adjacent to the first die.

Example 53 includes the microelectronic package of example 52, wherein the leg portion is coupled with the package substrate by an adhesive material.

Example 54 includes the microelectronic package of example 52, wherein the leg portion is coupled with the package substrate by a second STIM thermal interconnect.

Example 55 includes the microelectronic package of example 54, wherein the leg portion is coupled with the package substrate by a second thermal underfill material that at least partially surrounds the second STIM thermal interconnect.

Example 56 includes the microelectronic package of example 52, wherein the microelectronic package further comprises: a second die that is coupled with the package substrate adjacent to the first die; a second plurality of STIM thermal interconnects coupled with, and positioned between, the second die and the IHS; and a second thermal underfill material positioned between the IHS and the second die, wherein the second thermal underfill material at least partially surrounds the second plurality of STIM thermal interconnects.

Example 57 includes the microelectronic package of example 56, wherein the second plurality of STIM thermal interconnects have a same z-height as measured in a direction perpendicular to a face of the second die to which they are coupled as a z-height of the first plurality of STIM thermal interconnects.

Example 58 includes the microelectronic package of example 56, wherein the second plurality of STIM thermal interconnects have a different z-height as measured in a direction perpendicular to a face of the second die to which they are coupled as a z-height of the first plurality of STIM thermal interconnects.

Example 59 includes the microelectronic package of any of examples 52-58, wherein the first plurality of STIM thermal interconnects have a z-height as measured in a direction perpendicular to the face of the first die of less than 150 micrometers.

Example 60 includes the microelectronic package of example 59, wherein the first plurality of STIM thermal interconnects have a z-height of less than 100 micrometers.

Example 61 includes the microelectronic package of example 60, wherein the first plurality of STIM thermal interconnects have a z-height of less than 50 micrometers.

Example 62 includes the microelectronic package of any of examples 52-58, wherein the thermal underfill material is epoxy.

Example 63 includes the microelectronic package of any of examples 52-58, wherein the first plurality of STIM thermal interconnects are coupled with the face of the first die in a two-dimensional array pattern.

Example 64 includes the microelectronic package of example 63, wherein the two-dimensional array pattern is a grid pattern.

Example 65 includes the microelectronic package of example 63, wherein the two-dimensional array pattern is a randomized pattern.

Example 66 includes the microelectronic package of any of examples 52-58, further comprising a patterning layer positioned between a STIM thermal interconnect of the plurality of STIM thermal interconnects and the IHS.

Example 67 includes the microelectronic package of any of examples 52-58, further comprising a solder resist layer coupled to the face of the first die and adjacent to, and at least partially surrounding, a STIM thermal interconnect of the plurality of STIM thermal interconnects.

Example 68 includes the microelectronic package of any of examples 52-58, further comprising a solder resist layer coupled to the IHS and adjacent to, and at least partially surrounding, a STIM thermal interconnect of the plurality of STIM thermal interconnects.

Example 69 includes the microelectronic package of any of examples 52-58, wherein a first STIM thermal interconnect of the plurality of STIM thermal interconnects has a different size or shape than a second STIM thermal interconnect of the plurality of STIM thermal interconnects.

Example 70 includes a microelectronic package comprising: a first die coupled with a package substrate; a first plurality of STIM thermal interconnects coupled with a face of the first die, wherein the first plurality of STIM thermal interconnects are at least partially surrounded by a first thermal underfill material; an IHS coupled with the first plurality of STIM thermal interconnects such that the first die is located between the IHS and the package substrate; and a spacer that is physically coupled with the IHS and the package substrate.

Example 71 includes the microelectronic package of example 70, further comprising a patterning layer positioned between a STIM thermal interconnect of the plurality of STIM thermal interconnects and the IHS.

Example 72 includes the microelectronic package of example 70, further comprising a solder resist layer coupled to the face of the first die and adjacent to, and at least partially surrounding, a STIM thermal interconnect of the plurality of STIM thermal interconnects.

Example 73 includes the microelectronic package of example 70, further comprising a solder resist layer coupled to the IHS and adjacent to, and at least partially surrounding, a STIM thermal interconnect of the plurality of STIM thermal interconnects.

Example 74 includes the microelectronic package of example 70, wherein a first STIM thermal interconnect of the plurality of STIM thermal interconnects has a different size or shape than a second STIM thermal interconnect of the plurality of STIM thermal interconnects.

Example 75 includes the microelectronic package of example 70, wherein the spacer is to stiffen an outer periphery of the IHS.

Example 76 includes the microelectronic package of example 70, wherein the spacer is to provide a mechanical load bearing spacing between the IHS and the package substrate.

Example 77 includes the microelectronic package of example 70, wherein the spacer is formed of steel, copper, aluminum, or polymer.

Example 78 includes the microelectronic package of example 70, wherein the spacer is a first spacer and wherein the microelectronic package further comprises a second spacer that is adjacent to the first spacer, and wherein the second spacer is physically coupled with the IHS and the package substrate.

Example 79 includes the microelectronic package of example 70, wherein the spacer is a unitary element that surrounds the first die.

Example 80 includes the microelectronic package of example 70, wherein the spacer is coupled with the package substrate or the IHS by an adhesive material.

Example 81 includes the microelectronic package of example 70, wherein the spacer is coupled with the package substrate or the IHS by a second STIM thermal interconnect.

Example 82 includes the microelectronic package of example 81, wherein the second thermal underfill material is at least partially surrounded by the second STIM thermal interconnect.

Example 83 includes the microelectronic package of example 70, wherein the spacer is a solder ball.

Example 84 includes the microelectronic package of any of example 70-83, wherein the microelectronic package further comprises: a second die that is coupled with the package substrate adjacent to the first die; a second plurality of STIM thermal interconnects coupled with, and positioned between the second die and the IHS; and a second thermal underfill material positioned between the IHS and the second die, wherein the second thermal underfill material at least partially surrounds the second plurality of STIM thermal interconnects.

Example 85 includes the microelectronic package of example 84, wherein the second plurality of STIM thermal interconnects have a same z-height as measured in a direction perpendicular to a face of the second die to which they are coupled as a z-height of the first plurality of STIM thermal interconnects.

Example 86 includes the microelectronic package of example 84, wherein the second plurality of STIM thermal interconnects have a different z-height as measured in a direction perpendicular to a face of the second die to which they are coupled as a z-height of the first plurality of STIM thermal interconnects.

Example 87 includes the microelectronic package of any of example 70-83, wherein the first plurality of STIM thermal interconnects have a z-height as measured in a direction perpendicular to the face of the first die of less than 150 micrometers.

Example 88 includes the microelectronic package of example 87, wherein the first plurality of STIM thermal interconnects have a z-height of less than 100 micrometers.

Example 89 includes the microelectronic package of example 88, wherein the first plurality of STIM thermal interconnects have a z-height of less than 50 micrometers.

Example 90 includes the microelectronic package of any of example 70-83, wherein the thermal underfill material is epoxy.

Example 91 includes the microelectronic package of any of example 70-83, wherein the first plurality of STIM thermal interconnects are coupled with the face of the first die in a two-dimensional array pattern.

Example 92 includes the microelectronic package of example 91, wherein the two-dimensional array pattern is a grid pattern.

Example 93 includes the microelectronic package of example 91, wherein the two-dimensional array pattern is a randomized pattern.

Example 94 includes a microelectronic package that includes: a first die coupled with a package substrate; a second die coupled with the package substrate; a first plurality of STIM thermal interconnects coupled with the first die; a second plurality of STIM thermal interconnects coupled with the second die; an IHS coupled with the first plurality of STIM thermal interconnects and the second plurality of STIM thermal interconnects; a first thermal underfill material positioned between the IHS and the first die, wherein the first thermal underfill material at least partially surrounds the first plurality of STIM thermal interconnects; and a second thermal underfill material positioned between the IHS and the second die, wherein the second thermal underfill material at least partially surrounds the second plurality of STIM thermal interconnects.

Example 95 includes the microelectronic package of example 94, further comprising a patterning layer positioned between a STIM thermal interconnect of the first plurality of STIM thermal interconnects and the IHS.

Example 96 includes the microelectronic package of example 94, further comprising a solder resist layer coupled to the first die and adjacent to, and at least partially surrounding, a STIM thermal interconnect of the first plurality of STIM thermal interconnects.

Example 97 includes the microelectronic package of example 94, further comprising a solder resist layer coupled to the IHS and adjacent to, and at least partially surrounding, a STIM thermal interconnect of the first plurality of STIM thermal interconnects.

Example 98 includes the microelectronic package of example 94, wherein a first STIM thermal interconnect of the first plurality of STIM thermal interconnects has a different size or shape than a second STIM thermal interconnect of the first plurality of STIM thermal interconnects.

Example 99 includes the microelectronic package of any of examples 94-98, wherein the second plurality of STIM thermal interconnects have a same z-height as measured in a direction perpendicular to a face of the second die to which they are coupled as a z-height of the first plurality of STIM thermal interconnects.

Example 100 includes the microelectronic package of any of examples 94-98, wherein the second plurality of STIM thermal interconnects have a different z-height as measured in a direction perpendicular to a face of the second die to which they are coupled as a z-height of the first plurality of STIM thermal interconnects.

Example 101 includes the microelectronic package of any of examples 94-98, wherein the first plurality of STIM thermal interconnects have a z-height as measured in a direction perpendicular to a face of the first die to which they are coupled of less than 150 micrometers.

Example 102 includes the microelectronic package of example 101, wherein the first plurality of STIM thermal interconnects have a z-height of less than 100 micrometers.

Example 103 includes the microelectronic package of example 102, wherein the first plurality of STIM thermal interconnects have a z-height of less than 50 micrometers.

Example 104 includes the microelectronic package of any of examples 94-98, wherein the first thermal underfill material is epoxy.

Example 105 includes the microelectronic package of any of examples 94-98, wherein the IHS is coupled with the package substrate.

Example 106 includes the microelectronic package of example 105, wherein a leg of the IHS is coupled with the package substrate.

Example 107 includes the microelectronic package of example 105, wherein the IHS and the package substrate are coupled with a spacer such that the spacer is at least partially between the IHS and the package substrate.

Example 108 includes the microelectronic package of example 107, wherein the spacer is a solder ball.

Example 109 includes the microelectronic package of example 107, wherein the spacer is coupled with the IHS or the package substrate by an adhesive material.

Example 110 includes the microelectronic package of example 107, wherein the STIM thermal interconnects are first STIM thermal interconnects and the thermal underfill material is first thermal underfill material, and wherein the spacer is coupled with the IHS or the package substrate by second STIM thermal interconnects that are at least partially surrounded by second thermal underfill material.

Example 111 includes the microelectronic package of any of examples 94-98, wherein the first plurality of STIM thermal interconnects are coupled with the first die in a two-dimensional array pattern.

Example 112 includes the microelectronic package of example 111, wherein the two-dimensional array pattern is a grid pattern.

Example 113 includes the microelectronic package of example 111, wherein the two-dimensional array pattern is a randomized pattern.

Example 114 includes a microelectronic package that includes aspects of, or related to, one or more of examples 1-113.

Example 115 includes a method that includes or portions of, or related to, one or more of examples 1-113.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package, comprising:
a package substrate;
a die coupled with the package substrate at a first face of the die;
a plurality of solder thermal interface material (STIM) thermal interconnects coupled with the die at a second face of the die, wherein the second face is opposite the first face;
an integrated heat spreader (IHS) coupled with the plurality of STIM thermal interconnects, wherein a first STIM thermal interconnect of the plurality of STIM thermal interconnects has a different size or shape than a second STIM thermal interconnect of the plurality of STIM thermal interconnects; and
a thermal underfill material positioned between the IHS and the die, wherein the thermal underfill material at least partially surrounds the plurality of STIM thermal interconnects.

2. The microelectronic package of claim 1, further comprising a patterning layer positioned between a STIM thermal interconnect of the plurality of STIM thermal interconnects and the IHS.

3. The microelectronic package of claim 1, further comprising a solder resist layer coupled to the second face of the die and adjacent to, and at least partially surrounding, a STIM thermal interconnect of the plurality of STIM thermal interconnects.

4. The microelectronic package of claim 1, further comprising a solder resist layer coupled to the IHS and adjacent to, and at least partially surrounding, a STIM thermal interconnect of the plurality of STIM thermal interconnects.

5. The microelectronic package of claim 1, wherein the plurality of STIM thermal interconnects is coupled with the second face of the die in a randomized pattern.

6. The microelectronic package of claim 1, wherein the plurality of STIM thermal interconnects is coupled with the second face of the die in a grid pattern.

7. The microelectronic package of claim 1, wherein a distance between the second face of the die and the IHS is less than 150 micrometers.

8. A microelectronic package comprising:
a die coupled with a package substrate;
a plurality of solder thermal interface material (STIM) thermal interconnects coupled with a face of the die, wherein the plurality of STIM thermal interconnects is at least partially surrounded by a thermal underfill material and has a height of less than 50 micrometers;
an integrated heat spreader (IHS) coupled with the plurality of STIM thermal interconnects, wherein the die is between the IHS and the package substrate; and
a spacer that is physically coupled with the IHS and the package substrate.

9. The microelectronic package of claim 8, further comprising a patterning layer between the IHS and an STIM thermal interconnect of the plurality of STIM thermal interconnects.

10. The microelectronic package of claim 8, further comprising a solder resist layer adjacent to an STIM thermal interconnect of the plurality of STIM thermal interconnects and coupled to the face of the die or the IHS.

11. The microelectronic package of claim 8, wherein the spacer includes steel, copper, aluminum, or polymer.

12. The microelectronic package of claim 8, wherein the spacer is a first spacer and wherein the microelectronic package further comprises a second spacer that is adjacent to the first spacer, and wherein the second spacer is physically coupled with the IHS and the package substrate.

13. The microelectronic package of claim 8, wherein the spacer is a solder ball.

14. The microelectronic package of claim 8, wherein the spacer is coupled with the package substrate or the IHS by an adhesive material or by a further STIM thermal interconnect.

15. A microelectronic package, comprising:
a die coupled with a package substrate;
a plurality of solder thermal interface material (STIM) thermal interconnects coupled with a face of the die, wherein the plurality of STIM thermal interconnects is at least partially surrounded by a thermal underfill material; and
an integrated heat spreader (IHS) coupled with the package substrate and the plurality of STIM thermal interconnects, wherein the die is between the IHS and the package substrate, wherein the IHS includes a leg portion coupled with the package substrate.

16. The microelectronic package of claim 15, wherein the leg portion is coupled with the package substrate by an adhesive material or by a further STIM thermal interconnect.

17. The microelectronic package of claim 15, wherein the die is a first die, the plurality of STIM thermal interconnects is a first plurality of STIM thermal interconnects, the thermal underfill material is a first thermal underfill material, and the microelectronic package further includes:
a second die coupled with the package substrate;
a second plurality of STIM thermal interconnects between the second die and the IHS; and
a second thermal underfill material between the IHS and the second die, wherein the second thermal underfill material at least partially surrounds the second plurality of STIM thermal interconnects.

18. The microelectronic package of claim 17, wherein the second plurality of STIM thermal interconnects has a different height as measured in a direction perpendicular to a face of the second die to which they are coupled as a height of the first plurality of STIM thermal interconnects.

19. The microelectronic package of claim 15, wherein a height of the plurality of STIM thermal interconnects is less than 150 micrometers.

20. The microelectronic package of claim 15, wherein the plurality of STIM thermal interconnects is coupled with the face of the die in a two-dimensional array pattern.

* * * * *